(12) United States Patent
Kim

(10) Patent No.: US 7,994,538 B2
(45) Date of Patent: Aug. 9, 2011

(54) SEMICONDUCTOR DEVICE AND METHOD OF MANUFACTURING THE SAME

(75) Inventor: Young Suk Kim, Kawasaki (JP)

(73) Assignee: Fujitsu Semiconductor Limited, Yokohama (JP)

( * ) Notice: Subject to any disclaimer, the term of this patent is extended or adjusted under 35 U.S.C. 154(b) by 222 days.

(21) Appl. No.: 12/205,074

(22) Filed: Sep. 5, 2008

(65) Prior Publication Data

US 2009/0095982 A1    Apr. 16, 2009

(30) Foreign Application Priority Data

Oct. 11, 2007   (JP) .................................. 2007-265121

(51) Int. Cl.
H01L 31/0328 (2006.01)
H01L 31/0336 (2006.01)
H01L 31/072 (2006.01)
H01L 31/109 (2006.01)

(52) U.S. Cl. .......... 257/190; 257/E21.403; 257/E21.409

(58) Field of Classification Search .................. 257/190, 257/E29.193, E21.403, E21.409

See application file for complete search history.

(56) References Cited

U.S. PATENT DOCUMENTS

| 2006/0138398 A1 | 6/2006 | Shimamune et al. |
| 2007/0264810 A1 | 11/2007 | Kim et al. |

FOREIGN PATENT DOCUMENTS

| JP | 2004-039831 A | 2/2004 |
| JP | 2006-186240 A | 7/2006 |
| KP | 10-0722939 B1 | 5/2007 |

OTHER PUBLICATIONS

Chinese Office Action dated Dec. 11, 2009, issued in corresponding Chinese Patent Application No. 2008101701751.

Primary Examiner — David S Blum
(74) Attorney, Agent, or Firm — Westerman, Hattori, Daniels & Adrian, LLP

(57) ABSTRACT

A semiconductor device to which a stress technique is applied and in which a leakage current caused by silicidation can be suppressed. A gate electrode is formed over an element region defined by an isolation region formed in a semiconductor substrate with a gate insulating film between. Extension regions and source/drain regions are formed in the element region on both sides of the gate electrode. In addition, a semiconductor layer which differs from the semiconductor substrate in lattice constant is formed apart from at least part of the isolation region. By doing so, the formation of a spike near the isolation region is suppressed even if a silicide layer is formed. Accordingly, a leakage current caused by such a spike can be suppressed.

14 Claims, 26 Drawing Sheets

SEMICONDUCTOR DEVICE AND METHOD OF MANUFACTURING THE SAME

CROSS-REFERENCE TO RELATED APPLICATIONS

This application is based upon and claims the benefits of priority from the prior Japanese Patent Application No. 2007-265121, filed on Oct. 11, 2007, the entire contents of which are incorporated herein by reference.

BACKGROUND OF THE INVENTION (1) Field of the Invention

This invention relates to a semiconductor device and a method of manufacturing a semiconductor device and, more particularly, to a semiconductor device to which a stress technique is applied and a method of manufacturing such a semiconductor device.

(2) Description of the Related Art

In recent years attention has been riveted on what is called a stress technique as a technique for realizing a high speed without performing microfabrication. Carrier mobility can be improved by using this stress technique.

For example, a technique for forming portions of a source and a drain of a p-channel MOS field-effect transistor (pMOS transistor) formed over a silicon (Si) substrate by the use of a silicon germanium (SiGe) layer which differs from the Si substrate in lattice constant and for improving hole mobility by creating a compressive stress in a channel region is proposed.

Even if nickel silicide or cobalt silicide is formed in a pMOS transistor in which silicon germanium is used or an nMOS transistor in which silicon carbide (SiC) is used in order to reduce the resistance of a source and a drain, it is necessary to reduce a leakage current of the pMOS transistor or the nMOS transistor.

SUMMARY OF THE INVENTION

According to an aspect of the invention, a semiconductor device comprising an isolation region formed in a semiconductor substrate, a gate electrode formed over an element region defined by the isolation region formed in the semiconductor substrate, and a semiconductor layer which is located in the element region at both sides of the gate electrode apart from at least part of the isolation region is provided.

BRIEF DESCRIPTION OF THE DRAWINGS

FIG. 5 is a fragmentary schematic sectional view showing the step of forming a gate electrode material and the like.

DESCRIPTION OF THE PREFERRED EMBODIMENTS

The inventors of the present invention found that if a silicidation step is applied to a transistor in which SiGe or SiC is used, the following problems arise.

Figure 22:
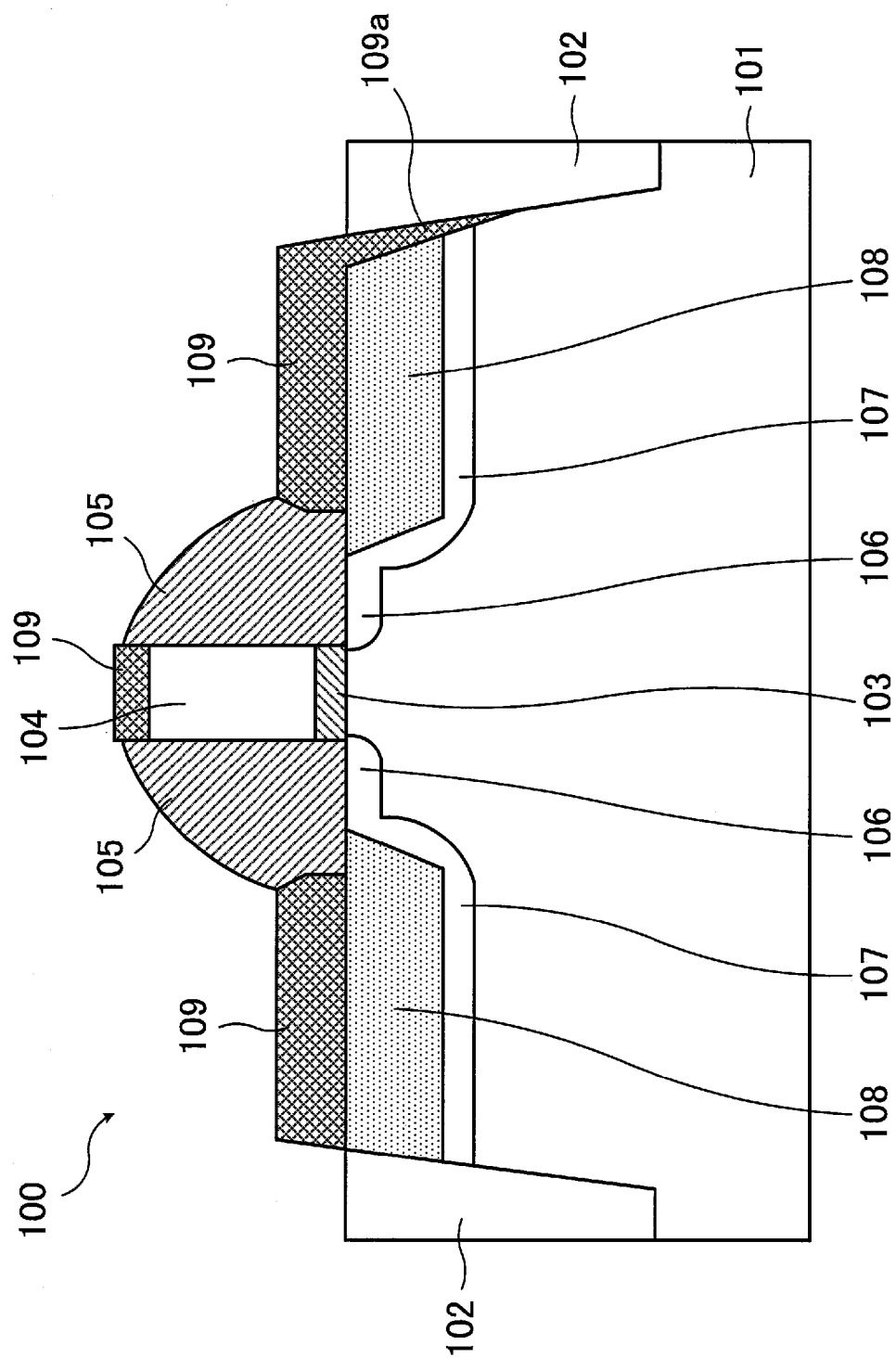
FIG. 22 is a fragmentary schematic sectional view showing an example of the state of a pMOS transistor after silicidation.

FIG. 22 is a fragmentary schematic sectional view showing an example of the state of a pMOS transistor after silicidation.

With a pMOS transistor 100 shown in FIG. 22, a gate electrode 104 is formed over an element region of a Si substrate 101 defined by an isolation region 102 formed by a shallow trench isolation (STI) method with a gate insulating film 103 between. Side wall spacers 105 are formed on the sides of the gate electrode 104. Source/drain extension regions (extension regions) 106, source/drain regions 107, and a SiGe layer 108 are formed in the element region on both sides of the gate electrode 104.

After a recess is formed in the Si substrate 101, usually the SiGe layer 108 is formed by making SiGe epitaxial-grow in the recess. A nickel silicide (NiSi) layer 109 is formed by performing silicidation by the use of nickel (Ni).

However, when the nickel silicide layer 109 is formed, silicidation may progress from an interface between the SiGe layer 108 and the isolation region 102 to the inside of the Si substrate 101. As a result, a spike 109a is formed. In this case, a leakage current flows because of the spike 109a when the pMOS transistor 100 operates. Moreover, if the spike 109a is formed in an area where the gate electrode 104 and the isolation region 102 intersect, a leakage current flows or a short circuit occurs in certain circumstances. Such a leakage current or the like causes a decrease in yield or an increase in power consumption.

The formation of the spike 109a can be suppressed by controlling conditions under which silicidation is performed. However, a MOS transistor having another structure may also be formed over the Si substrate 101. If, for example, a MOS transistor to which the stress technique is not applied is formed in another element region the Si substrate 101, usually silicidation is performed on the pMOS transistor 100 and the MOS transistor to which the stress technique is not applied at the same time. Accordingly, it is difficult to optimize conditions under which silicidation is performed.

Embodiments of the present invention will now be described in detail with reference to the drawings.

The principles underlying a semiconductor device according to the present invention will be described first.

Figure 1:
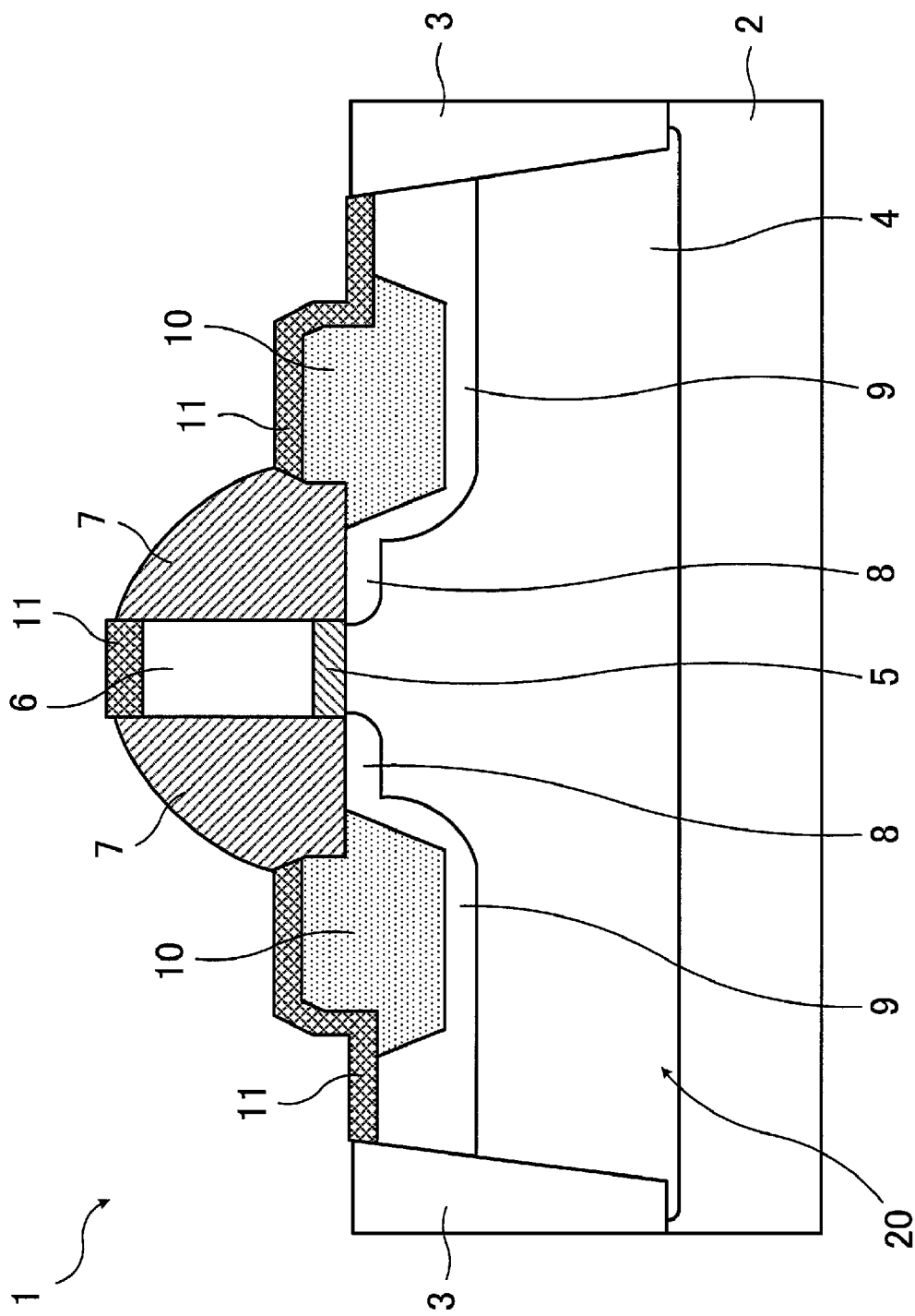
FIG. 1 is a fragmentary schematic sectional view showing a MOS transistor.

FIG. 1 is a fragmentary schematic sectional view showing a MOS transistor.

With a MOS transistor 1 shown in FIG. 1, an isolation region 3 is formed in a semiconductor substrate, such as a Si substrate, 2 by the STI method and a well 4 is formed in an element region 20 defined by the isolation region 3 by doping the element region 20 with dopant impurities of a predetermined conduction type. A gate electrode 6 is formed over the element region 20 of the semiconductor substrate 2 with a gate insulating film 5 of, for example, a silicon oxide film between by using, for example, polycrystalline silicon. Side wall spacers 7 of an insulating film, such as a silicon oxide film, are formed on the sides of the gate electrode 6.

Extension regions 8 are formed in shallow portions of the element region 20 on both sides of the gate electrode 6 by doping the element region 20 with dopant impurities of a predetermined conduction type. Source/drain regions 9 are formed outside the extension regions 8 by doping deeper portions of the element region 20 with dopant impurities of the predetermined conduction type. In addition, a semiconductor layer 10 which differs from the semiconductor substrate 2 in lattice constant is formed in the element region 20 on both sides of the gate electrode 6.

Moreover, a silicide layer 11 of nickel silicide, cobalt silicide, or the like is formed in surface portions of the gate electrode 6, the source/drain regions 9, and the semiconductor layer 10.

With the MOS transistor 1 having the above structure, the semiconductor layer 10 which differs from the semiconductor substrate 2 in lattice constant is formed in the regions which function as a source/drain. As a result, a stress is created in a channel region formed right under the gate electrode 6. This improves the mobility of carriers which move through the channel region. For example, if a Si substrate is used as the semiconductor substrate 2 and the MOS transistor 1 is a pMOS transistor, then the semiconductor layer 10 may be a SiGe layer or a silicon germanium carbide (SiGeC) layer. In this case, a compressive stress is created in the channel region. If a Si substrate is used as the semiconductor substrate 2 and the MOS transistor 1 is an n-channel MOS transistor (nMOS transistor), then the semiconductor layer 10 may be a SiC layer. In this case, a tensile stress is created in the channel region. The SiGe layer, the SiGeC layer, or the SiC layer may contain another element.

With the MOS transistor 1, as shown in FIG. 1, the semiconductor layer 10 is formed apart from the isolation region 3.

Usually the silicide layer 11 is formed in the following way. A metal film of, for example, nickel is formed over an entire surface in a state in which the isolation region 3, the gate electrode 6, the side wall spacers 7, the source/drain regions 9, and the semiconductor layer 10 are exposed. Heat treatment is performed so as to make the metal contained in the metal film react with silicon contained in the gate electrode 6, the source/drain regions 9, and the semiconductor layer 10. However, if a semiconductor layer which, like the semiconductor layer 10, is used for creating a stress in the channel region is not formed apart from the isolation region 3, a spike may be formed at an interface between the semiconductor layer and the isolation region 3 at the time of silicidation because of excess metal. This depends on the composition of the semiconductor layer, conditions under which silicidation is performed, or the like.

With the MOS transistor 1 shown in FIG. 1, however, the semiconductor layer 10 is formed apart from the isolation region 3 and the formation of the above spike can be suppressed. Therefore, a leakage current caused by a spike formed can be suppressed.

Figure 2:
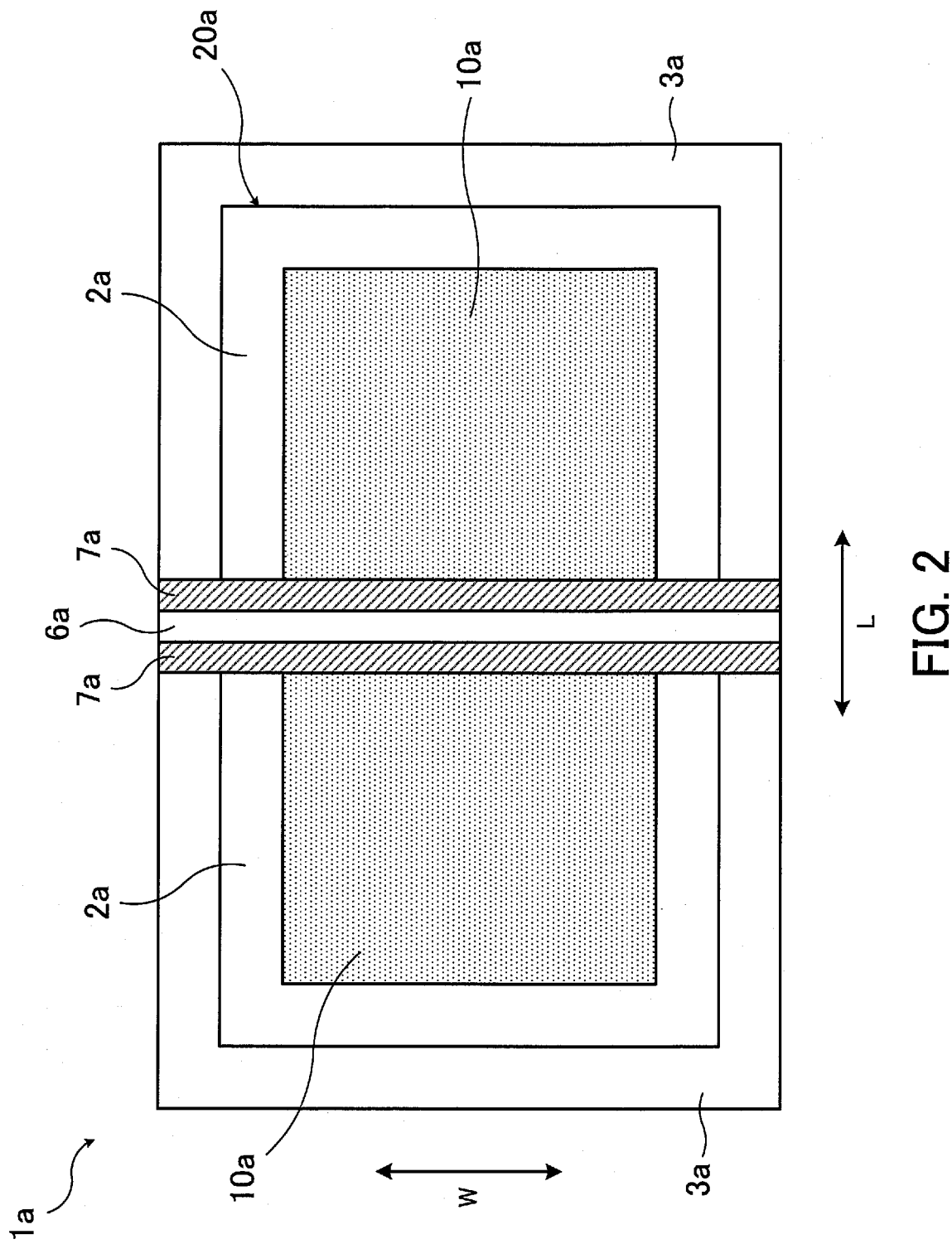
FIG. 2 is a fragmentary schematic plan view showing a first example.
Figure 3:
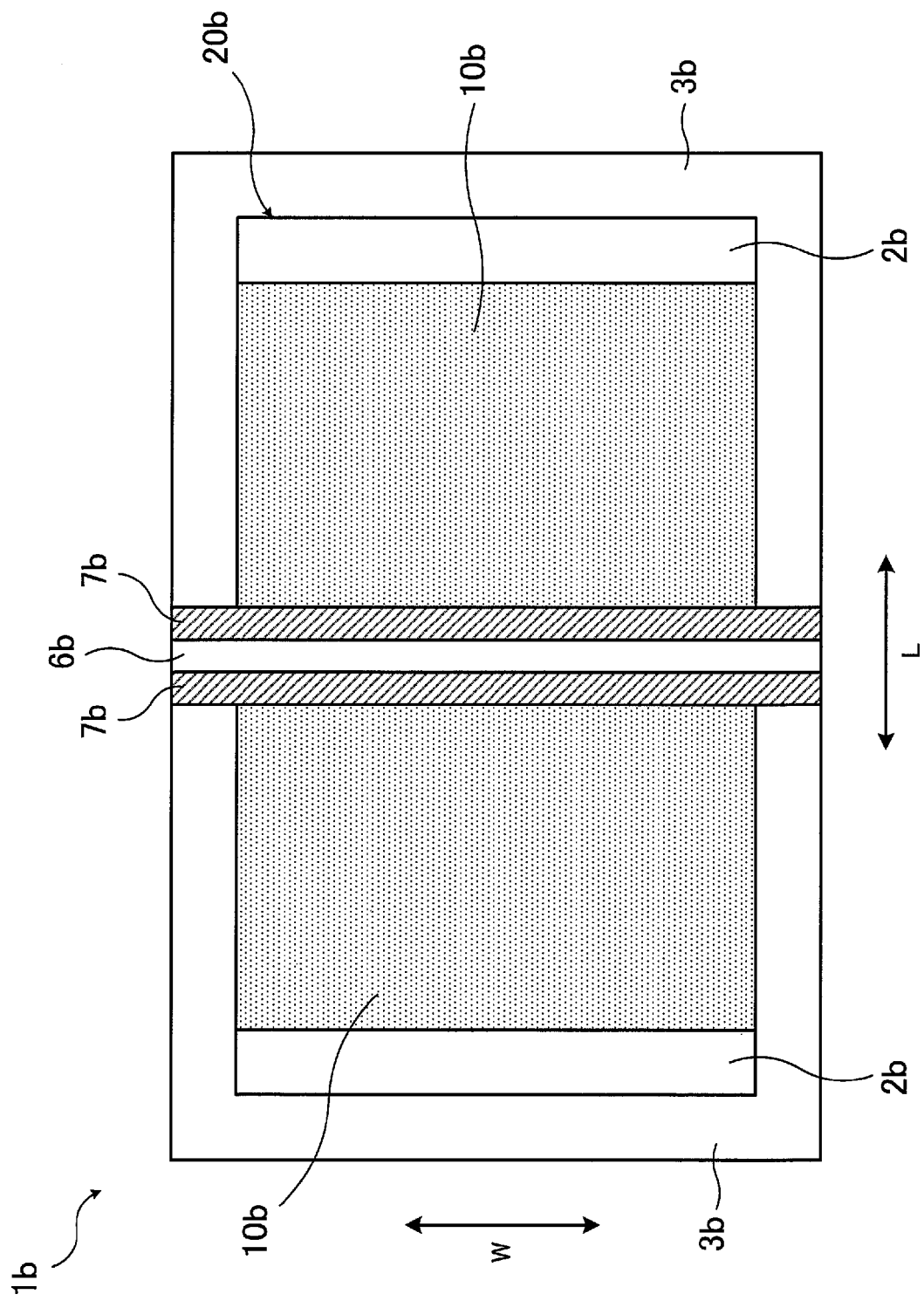
FIG. 3 is a fragmentary schematic plan view showing a second example.
Figure 4:
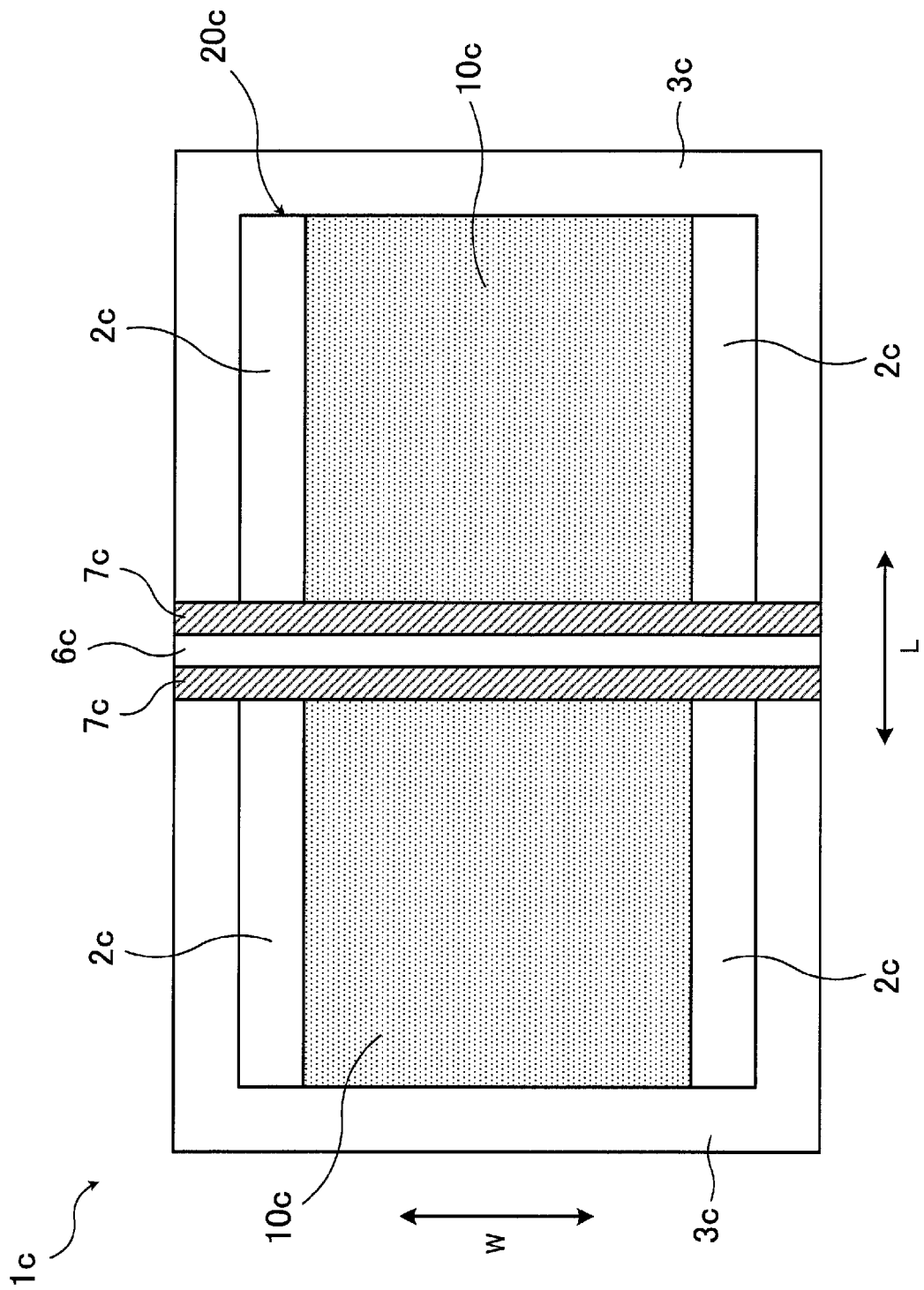
FIG. 4 is a fragmentary schematic plan view showing a third example.

Examples of a structure in which, like the MOS transistor 1 shown in FIG. 1, a semiconductor layer is formed apart from an isolation region are shown in FIGS. 2 through 4.

FIG. 2 is a fragmentary schematic plan view showing a first example.

FIG. 2 is a fragmentary schematic plan view showing a MOS transistor 1a before the formation of a silicide layer the structure of which is the same as that of the MOS transistor 1 shown in FIG. 1. With the MOS transistor 1a, a gate electrode 6a on the sides of which side wall spacers 7a are formed is formed over an element region 20a of a semiconductor substrate 2a defined by an isolation region 3a and a semiconductor layer 10a is formed in the element region 20a on both sides of the gate electrode 6a.

In the example shown in FIG. 2, the semiconductor layer 10a is formed apart from the whole of the isolation regions 3a which surrounds the element region 20a. By adopting the structure shown in FIG. 2, the formation of a spike near the isolation region 3a can be suppressed and a leakage current can effectively be suppressed.

With the structure shown in FIG. 2, the semiconductor layer 10a is formed so that all edge portions of the semiconductor layer 10a will be located apart from the isolation region 3a. Accordingly, the volume of the semiconductor layer 10a in the element region 20a decreases and a strain which occurs in the channel region decreases. This should be taken into consideration. In particular, the influence of such a decrease in strain may become greater with a decrease in the size of the MOS transistor 1a. Attention should be paid to this.

FIG. 3 is a fragmentary schematic plan view showing a second example.

FIG. 3 is a fragmentary schematic plan view showing a MOS transistor 1b before the formation of a silicide layer the structure of which is the same as that of the MOS transistor 1 shown in FIG. 1. With the MOS transistor 1b, a gate electrode 6b on the sides of which side wall spacers 7b are formed is formed over an element region 20b of a semiconductor substrate 2b defined by isolation region 3b. This is the same with the above MOS transistor 1a shown in FIG. 2.

In the example shown in FIG. 3, a semiconductor layer 10b is formed on both sides of the gate electrode 6b apart from portions of the isolation region 3b, which surrounds the element region 20b, in a gate length direction (channel direction) L. By adopting the structure shown in FIG. 3, it is possible to suppress the formation of a spike near the isolation region 3b, while ensuring the volume of the semiconductor layer 10b in the element region 20b. As a result, a leakage current can effectively be suppressed.

FIG. 4 is a fragmentary schematic plan view showing a third example.

FIG. 4 is a fragmentary schematic plan view showing a MOS transistor 1c before the formation of a silicide layer the structure of which is the same as that of the MOS transistor 1 shown in FIG. 1. With the MOS transistor 1c, a gate electrode 6c on the sides of which side wall spacers 7c are formed is formed over an element region 20c of a semiconductor substrate 2c defined by an isolation region 3c. This is the same with the above MOS transistor 1a shown in FIG. 2.

In the example shown in FIG. 4, a semiconductor layer 10c is formed on both sides of the gate electrode 6c apart from portions of the isolation region 3c, which surrounds the element region 20c, in a gate width direction (direction perpendicular to the channel direction) W. By adopting the structure shown in FIG. 4, it is possible to suppress the formation of a spike near the isolation region 3c, while ensuring the volume of the semiconductor layer 10c in the element region 20c. As a result, a leakage current can effectively be suppressed.

When a MOS transistor including a semiconductor layer used for creating a predetermined stress in a channel region is formed, which of the structures shown in FIGS. 2 through 4 should be selected as the structure of the semiconductor layer is determined on the basis of the size of the MOS transistor, required characteristics, and the like. If a plurality of MOS transistors each including such a semiconductor layer are formed over one semiconductor substrate, a structure suitable for each MOS transistor should be selected from among the structures shown in FIGS. 2 through 4 on the basis of its size, its layout, required characteristics, and the like.

A structure in which a semiconductor layer is formed apart from an isolation region is not limited to the examples shown in FIGS. 2 through 4. That is to say, if a semiconductor layer is formed in an element region apart from at least part of an isolation region which surrounds the element region (including cases where portions of the semiconductor layer which are positioned apart from the isolation region are dotted), a certain leakage current suppression effect can be obtained.

The structure of a semiconductor device including the above MOS transistor and a method for fabricating such a semiconductor device will now be described by giving a concrete example.

Figure 5:
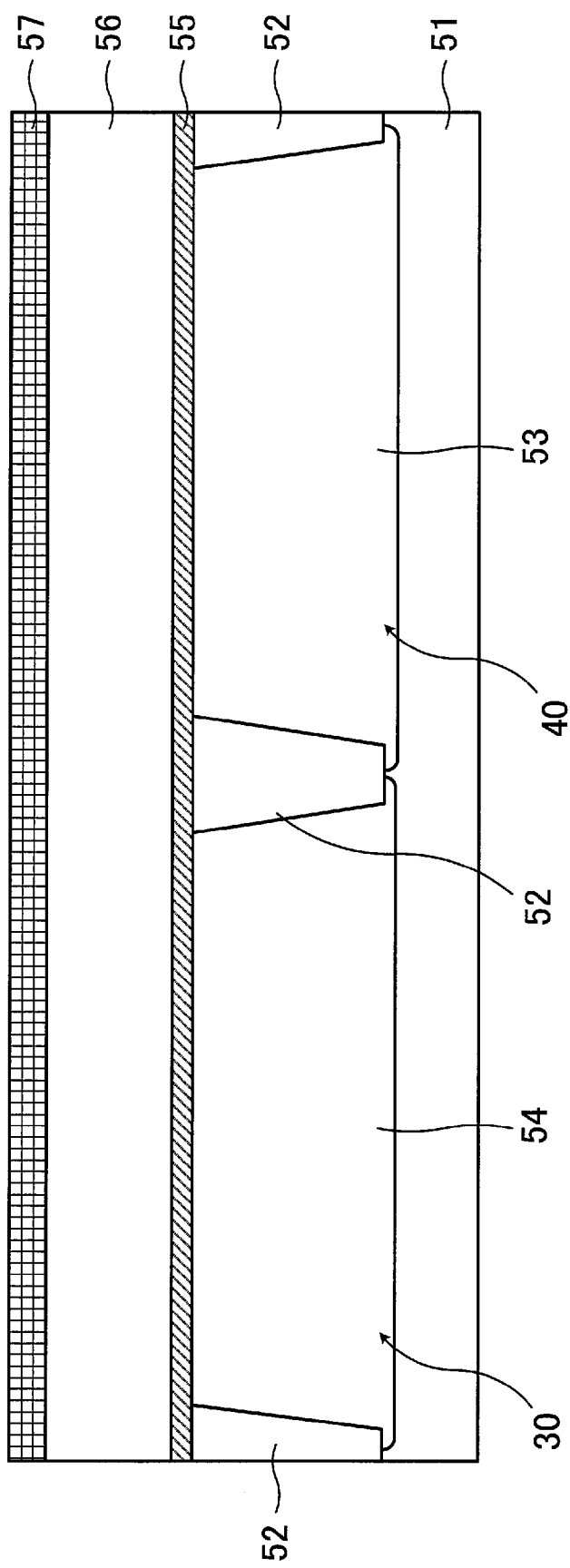

FIG. 5 is a fragmentary schematic sectional view showing the step of forming a gate electrode material and the like.

As shown in FIG. 5, an isolation region 52 used for defining an element region (pMOS formation region) 30 where a pMOS transistor is to be formed and an element region (nMOS formation region) 40 where an nMOS transistor is to be formed are formed first in a Si substrate 51. In this case, the STI method is used for forming the isolation region 52.

A photoresist film (not shown) is then formed over an entire surface by, for example, a spin coating method. After that, photolithography is used for forming an opening (not shown) in a region of the formed photoresist film corresponding to the nMOS formation region 40. The Si substrate 51 is doped with p-type dopant impurities with the photoresist film in which the opening is formed as a mask. By doing so, a p-type well 53 is formed in the nMOS formation region 40 of the Si substrate 51. The photoresist film is then removed.

The Si substrate 51 is doped with n-type dopant impurities in the same way. By doing so, an n-type well 54 is formed in the pMOS formation region 30 of the Si substrate 51.

An insulating film 55 with a thickness of 1.2 nm is then formed over an entire surface by, for example, a thermal oxidation method.

A polycrystalline silicon film 56 with a thickness of 100 nm which is a gate electrode material is then formed over an entire surface. A silicon nitride film 57 to be used as an etching mask is formed over the polycrystalline silicon film 56.

Figure 6:
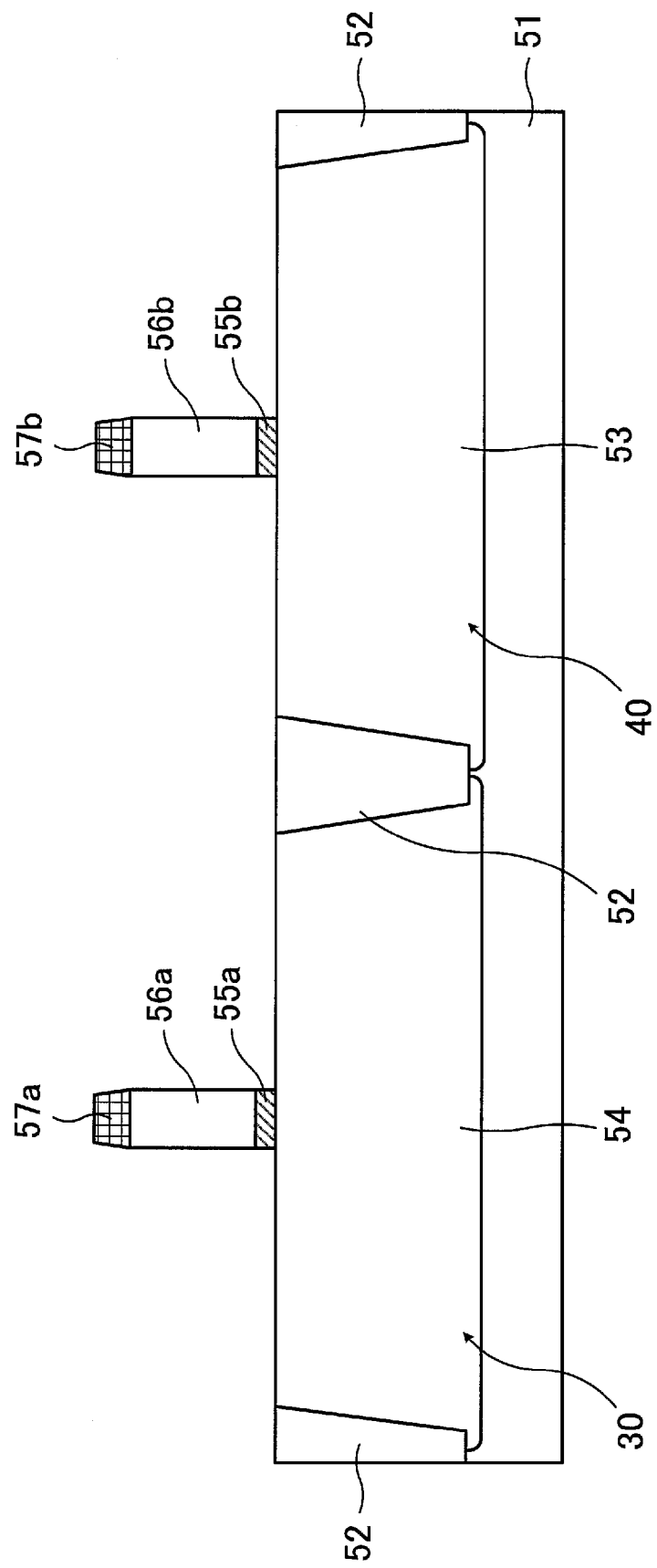
FIG. 6 is a fragmentary schematic sectional view showing a patterning step.

FIG. 6 is a fragmentary schematic sectional view showing a patterning step.

After the silicon nitride film 57 shown in FIG. 5 is formed, photolithography is used for performing patterning on the silicon nitride film 57 (silicon nitride films 57a and 57b). Patterning is performed on the polycrystalline silicon film 56 and the insulating film 55 with the silicon nitride films 57a and 57b as a mask. At this time anisotropic etching, for example, is used.

By performing such patterning, as shown in FIG. 6, a gate electrode 56a is formed over the PMOS formation region 30 with a gate insulating film 55a between and a gate electrode 56b is formed over the nMOS formation region 40 with a gate insulating film 55b between. After the patterning is performed, it is desirable that the silicon nitride films 57a and 57b over the gate electrodes 56a and 56b, respectively, should be left for protecting the gate electrodes 56a and 56b in steps performed after that.

Figure 7:
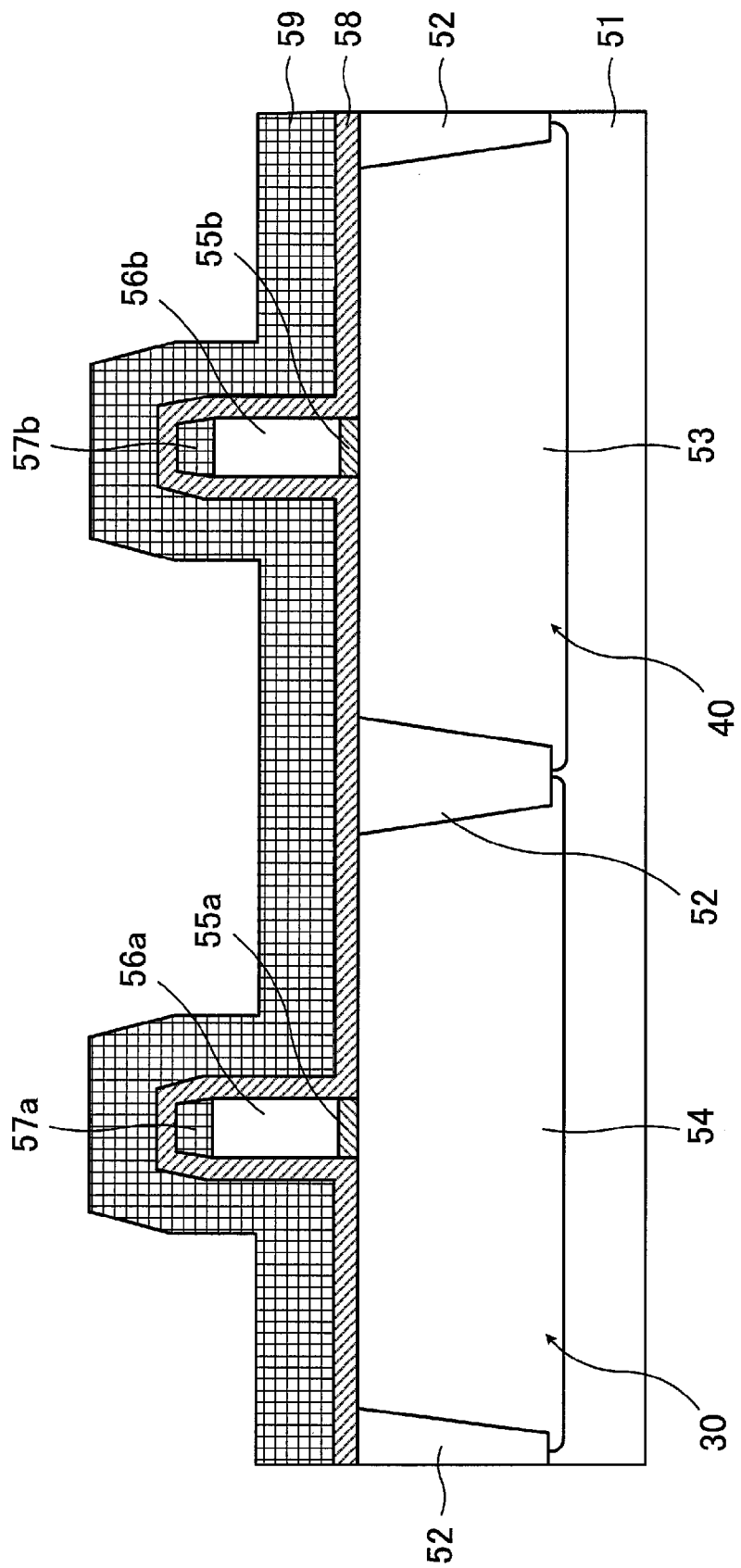
FIG. 7 is a fragmentary schematic sectional view showing the step of forming an insulating film.

FIG. 7 is a fragmentary schematic sectional view showing the step of forming an insulating film.

As shown in FIG. 7, a silicon oxide film 58 with a thickness of 5 to 30 nm is formed first over an entire surface by a thermal chemical vapor deposition (CVD) method after the patterning shown in FIG. 6 is performed. For example, tetraethylorthosilicate (TEOS) is used as a material and the silicon oxide film 58 is formed at a temperature of 550 to 700° C.

A silicon nitride film 59 with a thickness of 10 to 60 nm is then formed over the silicon oxide film 58 by the thermal CVD method. For example, dichlorosilane ($SiH_2Cl_2$) is used as a material and the silicon nitride film 59 is formed at a temperature of 600 to 800° C.

Figure 8:
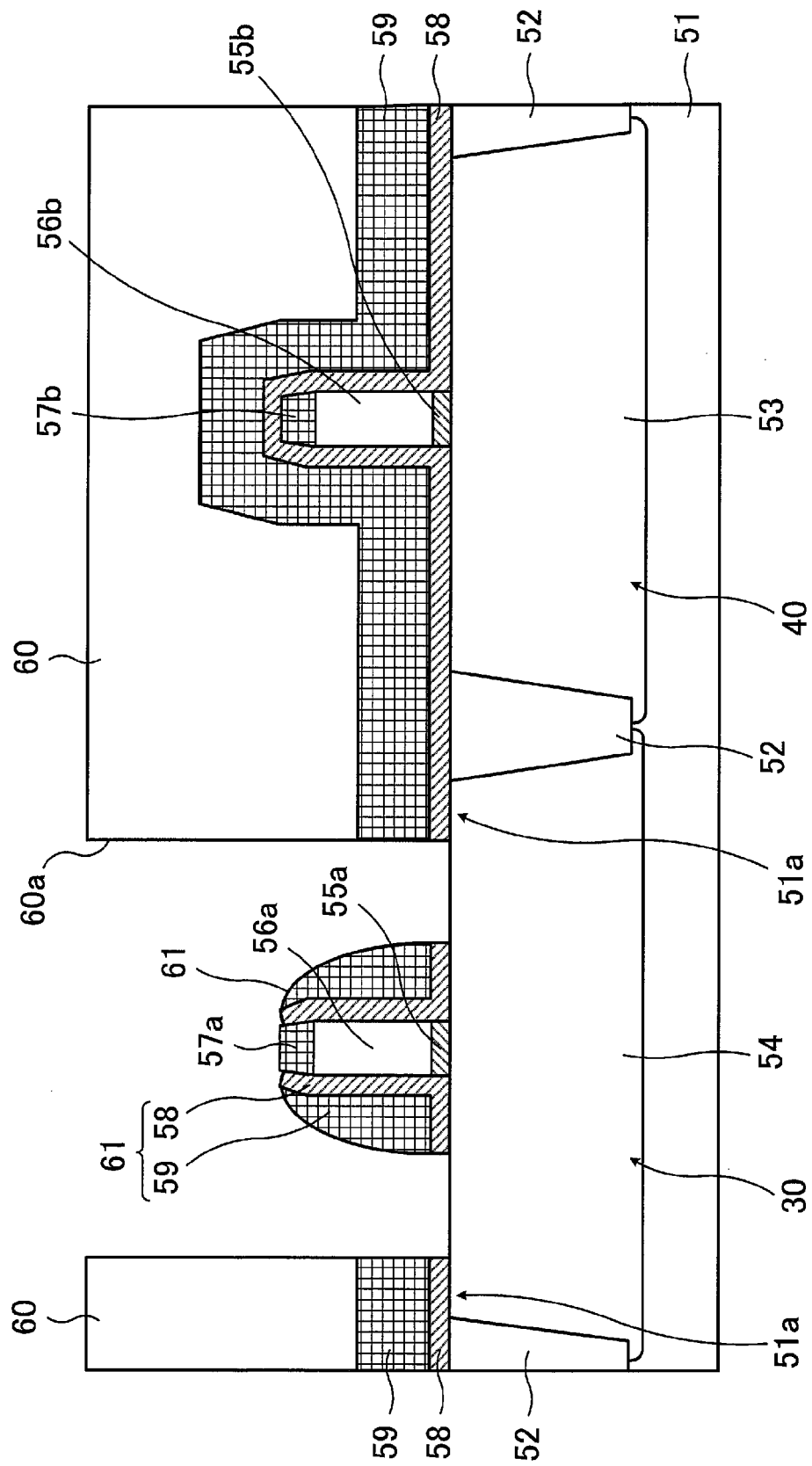
FIG. 8 is a fragmentary schematic sectional view showing the step of forming first side wall spacers.
Figure 9:
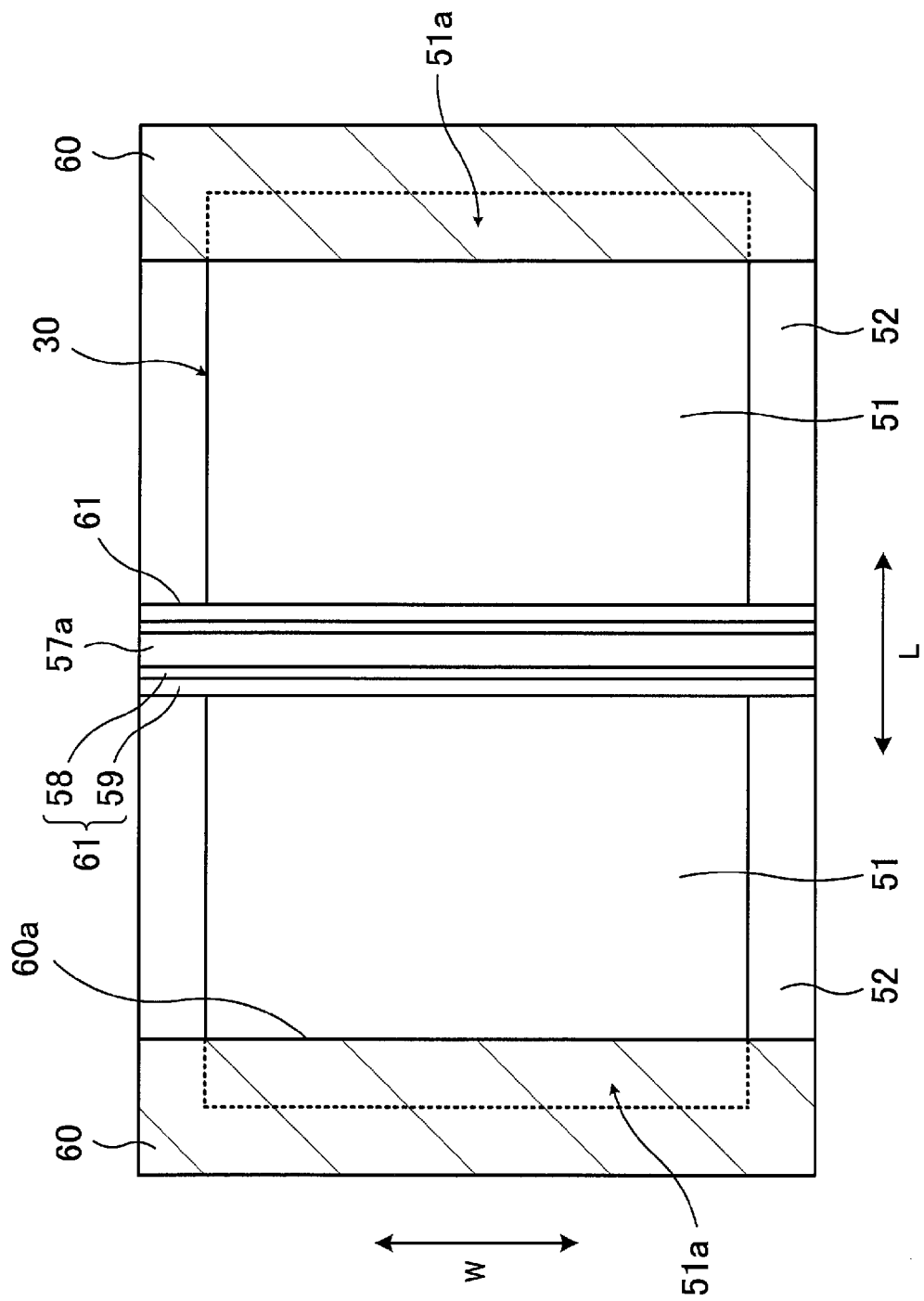
FIG. 9 is a schematic plan view showing a pMOS formation region and regions around the pMOS formation region in the step of forming the first side wall spacers.

FIG. 8 is a fragmentary schematic sectional view showing the step of forming first side wall spacers. FIG. 9 is a schematic plan view showing the pMOS formation region and regions around the pMOS formation region in the step of forming the first side wall spacers.

After the silicon oxide film 58 and the silicon nitride film 59 shown in FIG. 7 are formed, a photoresist film 60 is formed first over an entire surface by, for example, the spin coating method. Photolithography is used for forming an opening 60a having a predetermined shape over the pMOS formation region 30. In this case, as shown in FIG. 9, the opening 60a is formed in the photoresist film 60 so that part of end portions of the pMOS formation region 30 parallel to the gate width direction will be covered.

Anisotropic etching is performed on the silicon nitride film 59 and the silicon oxide film 58 over the pMOS formation region 30 with the photoresist film 60 in which the above opening 60a is formed as a mask. At this time hydrofluorocarbon gas, for example, is used as etching gas. By performing anisotropic etching in this way, side wall spacers (first side wall spacers) 61 each having a multilayer structure including the silicon oxide film 58 and the silicon nitride film 59 are formed on the sides of the gate electrode 56a over the pMOS formation region 30.

As shown in FIG. 8, the silicon oxide film 58 and the silicon nitride film 59 are left over boundary portions 51a by forming the opening 60a shown in FIGS. 8 and 9. The structure of a film which covers an interface between the isolation region 52 and the pMOS formation region 30 is not limited to the multilayer structure including the silicon oxide film 58 and the silicon nitride film 59 and shown in this example. A single layer of a silicon oxide film or a silicon nitride film which has the function of masking the interface between the isolation region 52 and the pMOS formation region 30 may be used. In addition, a photoresist mask can be used.

Regions where recesses 62 and 62a described later are to be formed (see FIGS. 10 and 11) and regions where a SiGe layer 63 is to be formed thereafter (see FIG. 12) depend on the shape of the opening 60a formed in the photoresist film 60 for forming the first side wall spacers 61 in this way.

Figure 10:
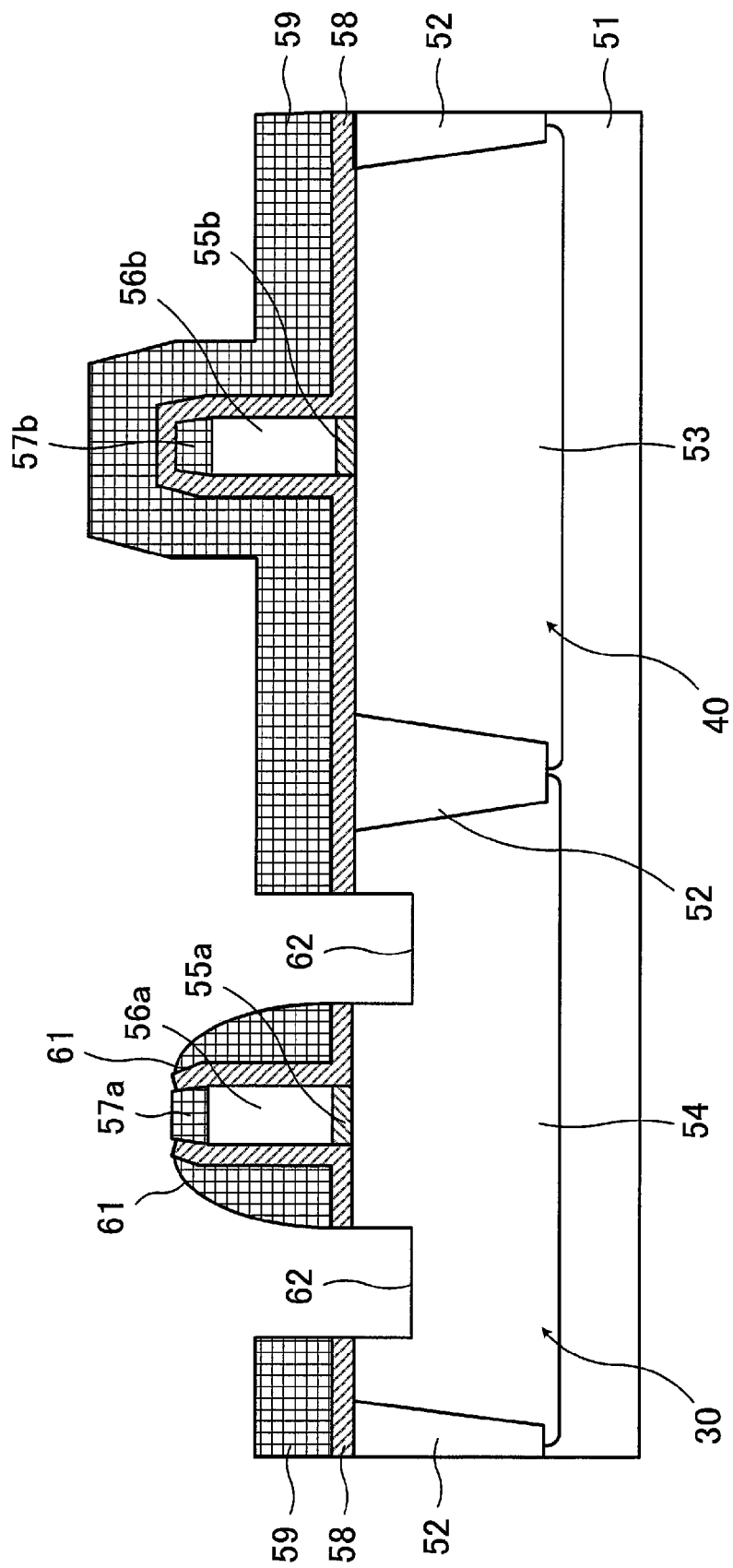
FIG. 10 is a fragmentary schematic sectional view showing a first recess formation step.

FIG. 10 is a fragmentary schematic sectional view showing a first recess formation step.

After the first side wall spacers 61 are formed by the use of the photoresist film 60 shown in FIGS. 8 and 9, selective etching (first etching) is performed on the Si substrate 51 which is exposed on both sides of the gate electrode 56a on the pMOS formation region 30 with the first side wall spacers 61 and the photoresist film 60 as a mask in order to form recesses 62. The first etching is, for example, reactive ion etching (RIE) using hydrogen bromide (HBr) gas as etching gas. The depth of the recesses 62 is, for example, about 50 nm. After the first etching is performed, the photoresist film 60 is removed.

Figure 11:
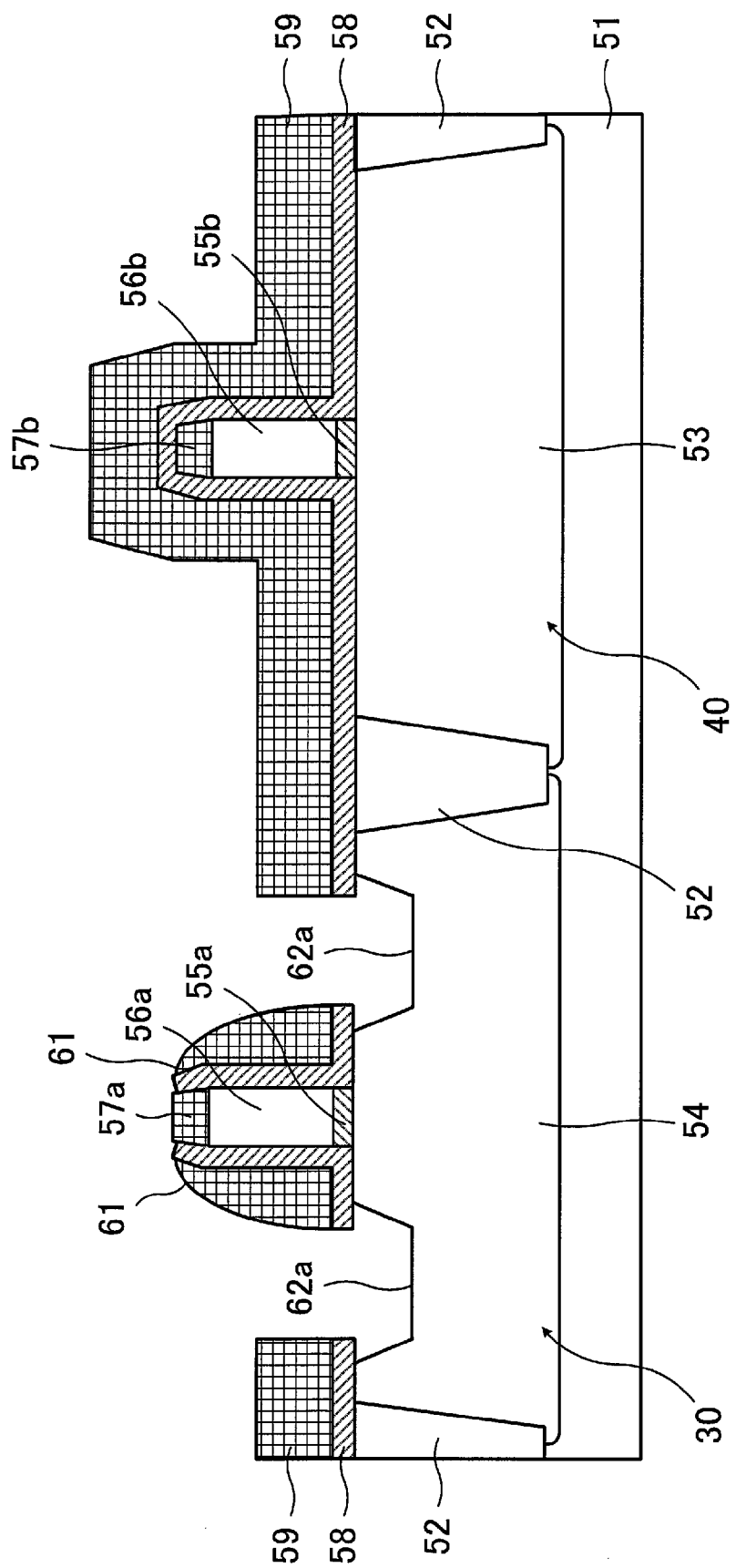
FIG. 11 is a fragmentary schematic sectional view showing a second recess formation step.

FIG. 11 is a fragmentary schematic sectional view showing a second recess formation step.

After the first etching shown in FIG. 10 is performed, wet treatment is performed by the use of hydrofluoric acid (HF). If an oxide film (native oxide film) exists on the surface of the recesses 62 formed in the pMOS formation region 30 of the Si substrate 51, it is impossible to make the SiGe layer 63 (see FIG. 12) described later epitaxial-grow in the recesses 62. The oxide film can be removed in advance by performing wet treatment by the use of hydrofluoric acid.

Chemical etching (second etching) is then performed on the recesses 62 shown in FIG. 10 with the silicon oxide film 58 and the silicon nitride film 59 as a mask in order to form recesses 62a shown in FIG. 11. For example, the second etching is performed at a temperature of 600 to 900° c. by the use of hydrogen chloride (HCl) gas, chlorine ($Cl_2$) gas, or the like. As a result, the depth of the recesses 62a increases by, for example, about 20 nm. By performing the second etching in this way, the shape of extension regions 65a (see FIG. 15) and source/drain regions 69a (see FIG. 17) described later can be controlled.

The recesses 62a shown in FIG. 11 may be formed by wet etching. However, if etching is performed in the above way by the use of HCl gas or $Cl_2$ gas, the recesses 62a are formed and selective epitaxial growth can be performed in the recesses 62a. In this case, another step is not performed after the formation of the recesses 62a. That is to say, the merit of performing etching in the above way is that the state of a surface after etching can be controlled comparatively easily.

Figure 12:
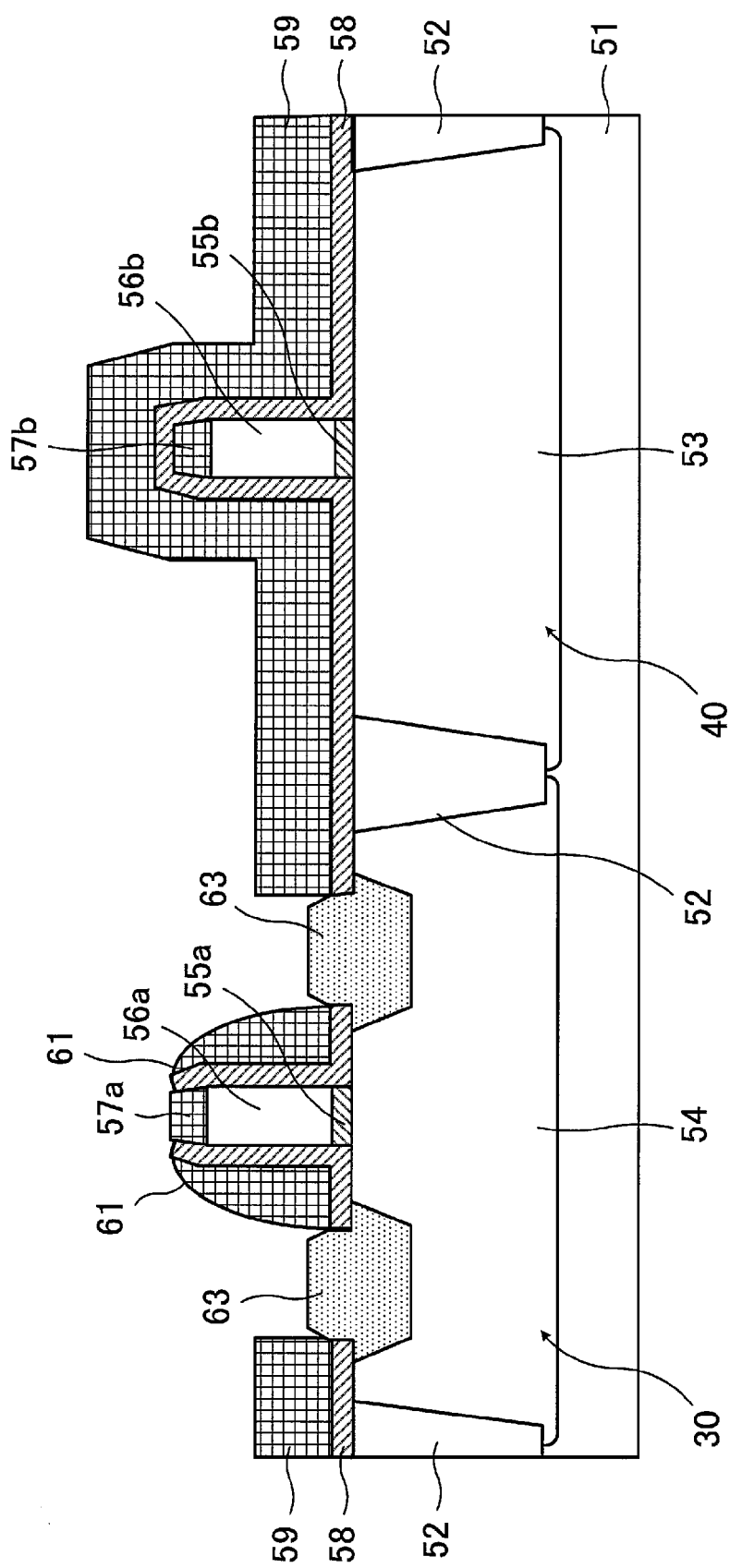
FIG. 12 is a fragmentary schematic sectional view showing the step of forming a SiGe layer.

FIG. 12 is a fragmentary schematic sectional view showing the step of forming a SiGe layer.

After the recesses 62a shown in FIG. 11 are formed, the SiGe layer 63 is made to selectively epitaxial-grow in the recesses 62a by, for example, a low pressure thermal CVD method. In this case, another step is not performed after the formation of the recesses 62a. For example, the SiGe layer 63 is formed at a temperature of 500 to 800° c. by using mixed gas which contains $SiH_2Cl_2$ gas, germane ($GeH_4$) gas, HCl gas, and hydrogen ($H_2$) gas as a material. Pressure in a chamber in which the SiGe layer 63 is formed is set to 100 to 5,000 Pa. The flow rates of $SiH_2Cl_2$ gas, $GeH_4$ gas, and HCl gas are set to, for example, 50 to 300 sccm, 50 to 300 sccm, and 30 to 300 sccm respectively.

A SiGeC layer may be formed in the recesses 62a in place of the SiGe layer 63. In this case, a material is obtained by adding, for example, methyl silane ($SiCH_6$) to the above mixed gas, and the flow rate of $SiCH_6$ gas is set to 2 to 50 sccm.

When the SiGe layer 63 or a SiGeC layer is formed, silane ($SiH_4$) gas, disilane ($Si_2H_6$) gas, trisilane ($Si_3H_8$) gas, or hexachlorotrisilane ($Si_3Cl_6$) gas may be used in place of $SiH_2Cl_2$ gas. In addition, dichlorogermane ($GeH_2Cl_2$) gas may be used in place of $GeH_4$ gas and $Cl_2$ gas may be used in place of HCl gas.

In this example, as stated above, the opening 60a is formed in the photoresist film 60 used in the step of forming the first side wall spacers 61 so that the boundary portion 51a will be covered. This is shown in FIGS. 8 and 9. Etching is performed by the use of the photoresist film 60. As shown in FIG. 10, the recesses 62 are then formed in exposed portions of the Si substrate 51. The recesses 62 formed are etched further. As a result, the recesses 62a are formed as shown in FIG. 11. As shown in FIG. 12, the SiGe layer 63 is formed in the recesses 62a. That is to say, regions where the recesses 62, the recesses 62a, and the SiGe layer 63 are formed depend on the shape of the opening 60a formed in the photoresist film 60 used in the step of forming the first side wall spacers 61. In this example, the SiGe layer 63 is formed apart from portions of the isolation region 52 parallel to a direction W of gate width.

The distance between the isolation region 52 and the SiGe layer 63 should be set to 5 to 100 nm, and preferably 10 to 100 nm. If the distance between the isolation region 52 and the SiGe layer 63 is shorter than 5 nm, the following problem arises. The position of the opening 60a formed in the photoresist film 60 may deviate. In this case, it is impossible to locate the SiGe layer 63 apart from desired portions of the isolation region 52. If the distance between the isolation region 52 and the SiGe layer 63 is longer than 100 nm, the volume of the SiGe layer 63 in the pMOS formation region 30 is small and a stress created in the channel region is weak. However, this depends on the structure of a pMOS transistor to be formed (especially on the distance between the isolation region 52 and the first side wall spacer 61). When the opening 60a is formed, attention should be paid to these problems.

Figure 13:
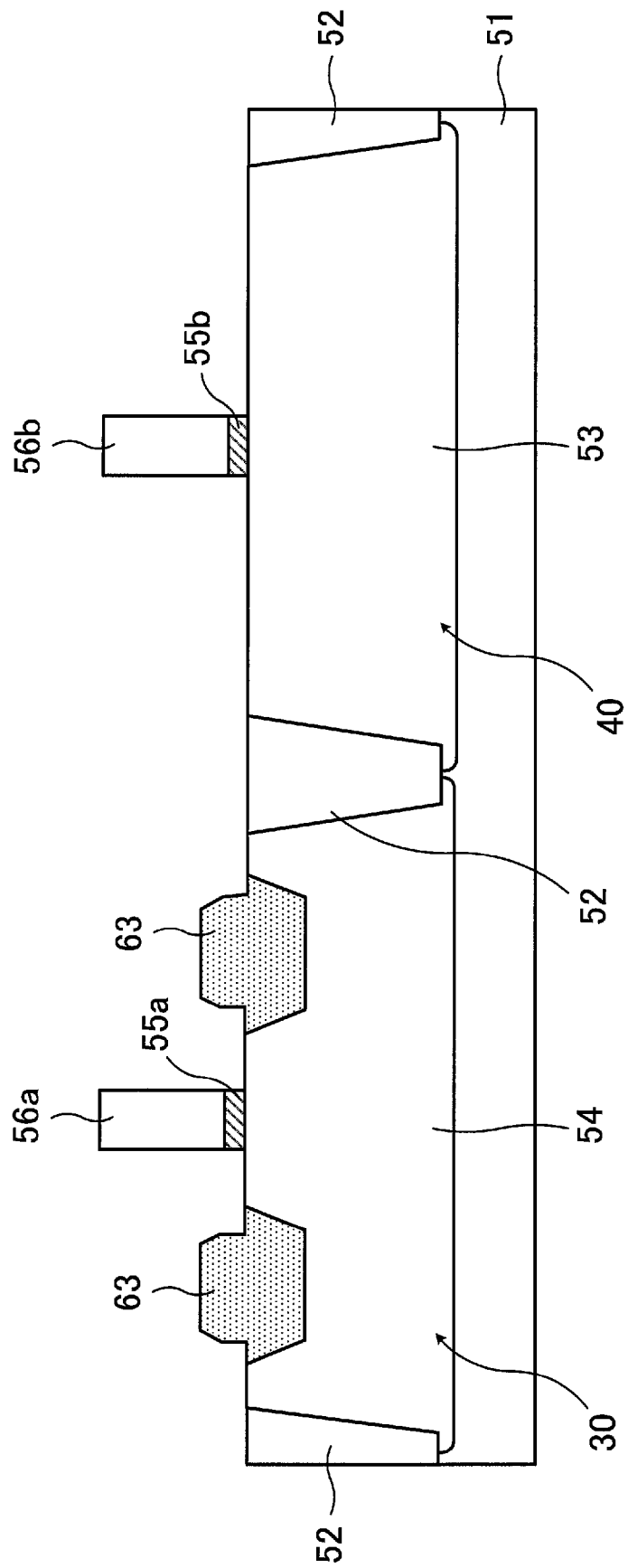
FIG. 13 is a fragmentary schematic sectional view showing the step of removing the insulating film.

FIG. 13 is a fragmentary schematic sectional view showing the step of removing the insulating film.

After the SiGe layer 63 shown in FIG. 12 is formed, the first side wall spacers 61, that is to say, the silicon nitride film 59 and the silicon oxide film 58 formed on the sides of the gate electrodes 56a and 56b are removed. Phosphoric acid ($H_3PO_4$) or the like is used for removing the silicon nitride film 59. Hydrofluoric acid (HF) or the like is used for removing the silicon oxide film 58.

Figure 14:
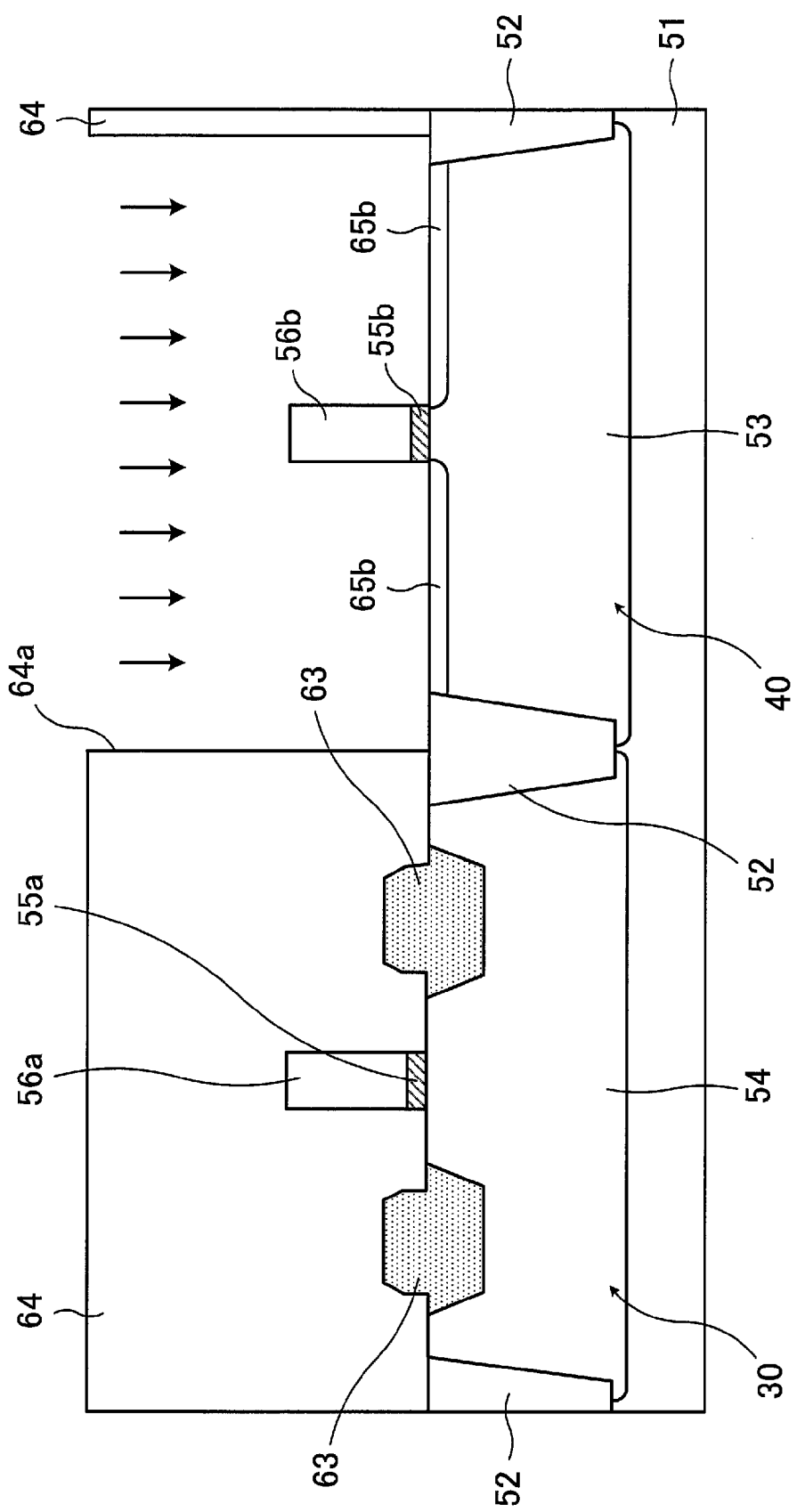
FIG. 14 is a fragmentary schematic sectional view showing a first extension region formation step.

FIG. 14 is a fragmentary schematic sectional view showing a first extension region formation step.

As shown in FIG. 14, a photoresist film 64 is formed first over an entire surface by, for example, the spin coating method after the silicon nitride film 59 and the silicon oxide film 58 are removed. Photolithography is used for forming an opening 64a in a region of the photoresist film 64 corresponding to the nMOS formation region 40.

Comparatively deep regions of the Si substrate 51 on both sides of the gate electrode 56b are then doped with p-type dopant impurities, such as indium (In), by, for example, an ion implantation method with the photoresist film 64 and the gate electrode 56b as a mask in order to form p-type pocket regions (not shown). For example, the p-type dopant impurities are implanted with a dose of $5 \times 10^{13}/cm^2$ at an acceleration energy of 50 keV.

Shallow regions of the Si substrate 51 on both sides of the gate electrode 56b are then doped with n-type dopant impurities, such as arsenic (As), by, for example, the ion implantation method with the photoresist film 64 and the gate electrode 56b as a mask in order to form extension regions 65b. For example, the n-type dopant impurities are implanted with a dose of $1 \times 10^{15}/cm^2$ at an acceleration energy of 5 keV. After the extension regions 65b are formed, the photoresist film 64 is removed.

Figure 15:
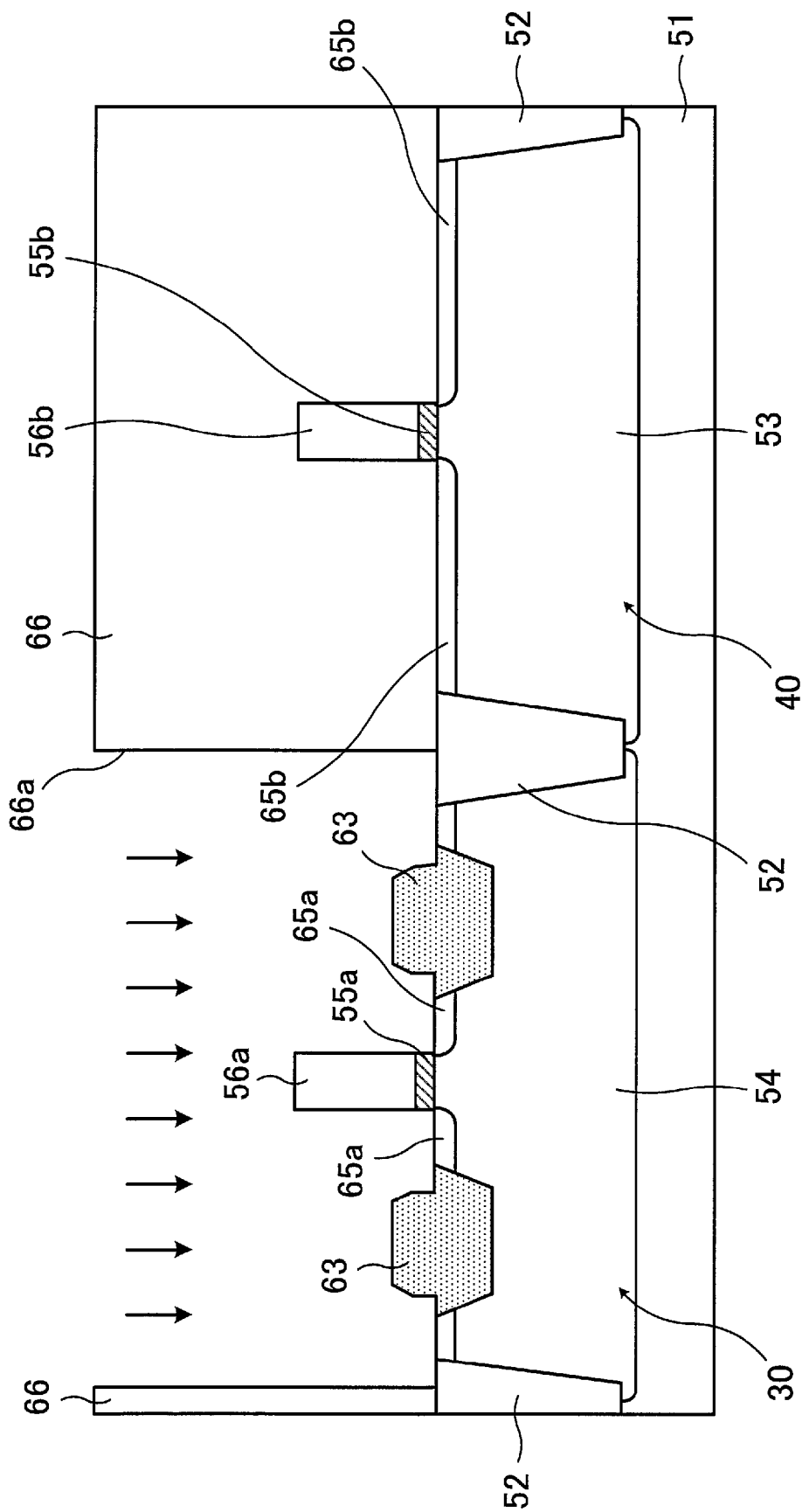
FIG. 15 is a fragmentary schematic sectional view showing a second extension region formation step.

FIG. 15 is a fragmentary schematic sectional view showing a second extension region formation step.

After that, the same step is performed in the pMOS formation region 30. That is to say, as shown in FIG. 15, a photoresist film 66 in which an opening 66a is formed in a region corresponding to the pMOS formation region 30 is formed. Comparatively deep regions of the Si substrate 51 are then doped with n-type dopant impurities, such as antimony (Sb), in order to form n-type pocket regions (not shown). Shallow regions of the Si substrate 51 are doped with p-type dopant impurities, such as boron (B), in order to form extension regions 65a. After the extension regions 65a are formed, the photoresist film 66 is removed.

Figure 16:
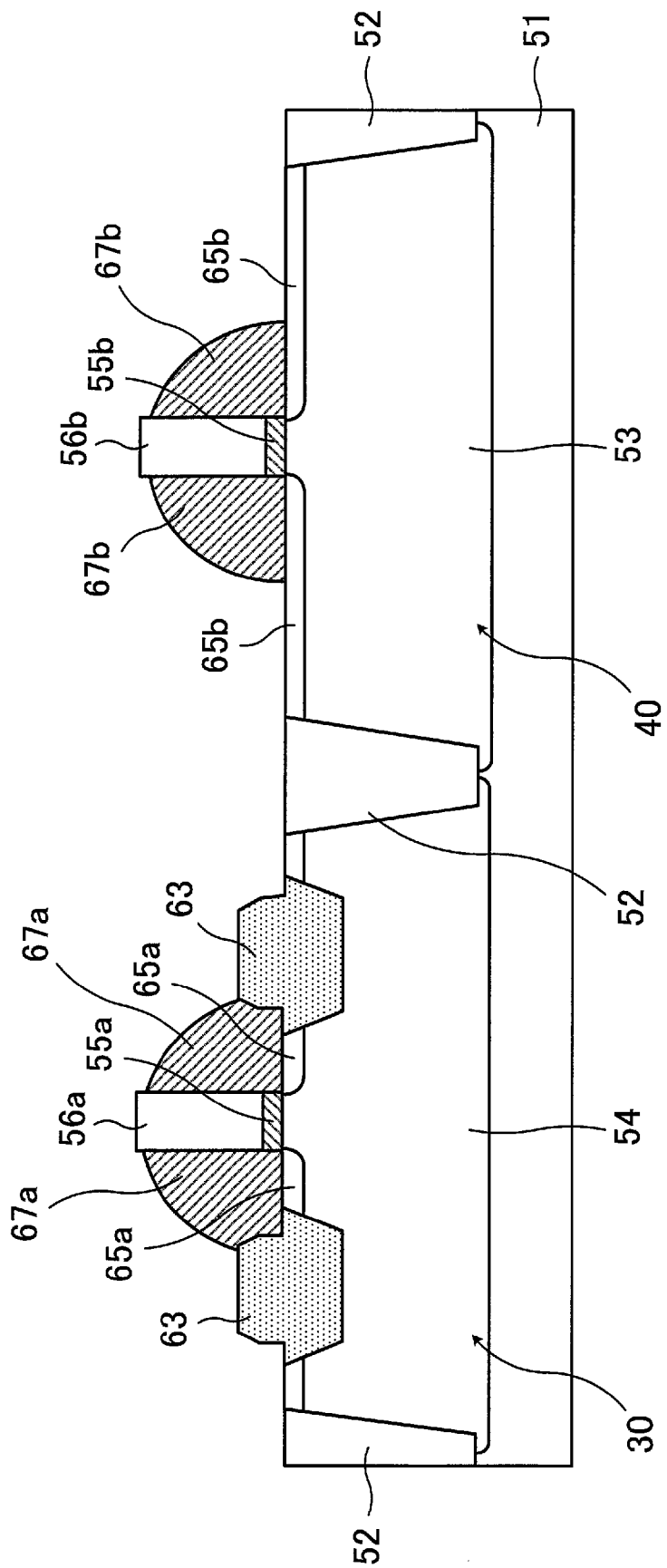
FIG. 16 is a fragmentary schematic sectional view showing the step of forming second side wall spacers.

FIG. 16 is a fragmentary schematic sectional view showing the step of forming second side wall spacers.

As shown in FIG. 16, a silicon oxide film with a thickness of 50 to 100 nm is formed over an entire surface by the thermal CVD method after the extension regions 65a and 65b and the like are formed. Anisotropic etching is then performed in order to form side wall spacers (second side wall spacers) 67a and 67b of the silicon oxide film on the sides of the gate electrodes 56a and 56b. The silicon oxide film is formed at a temperature of 500 to 580° C. by the use of, for example, bis-tertiary butylaminosilane (BTBAS) and oxygen ($O_2$).

Figure 17:
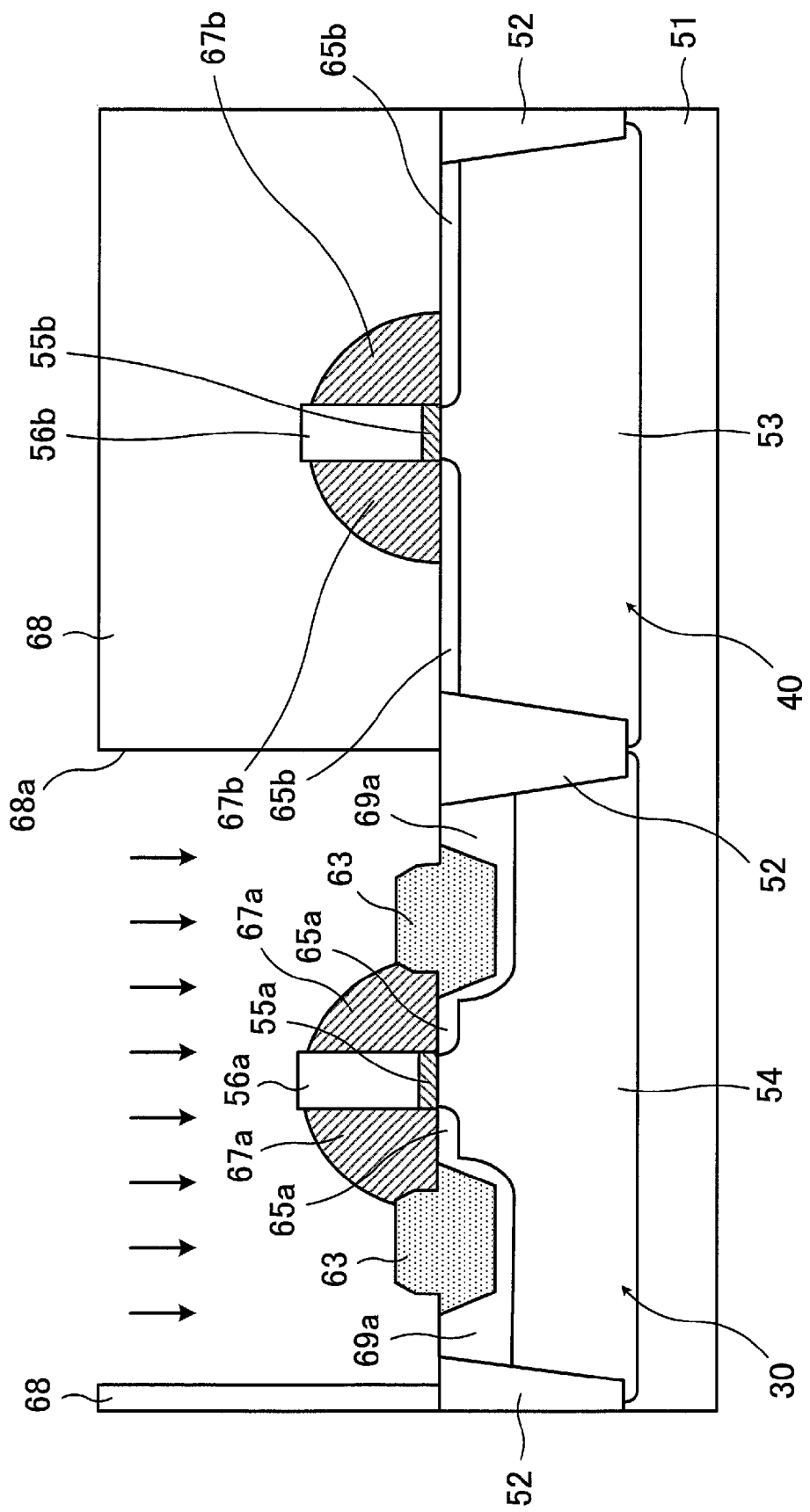
FIG. 17 is a fragmentary schematic sectional view showing a first source/drain region formation step.

FIG. 17 is a fragmentary schematic sectional view showing a first source/drain region formation step.

As shown in FIG. 17, a photoresist film 68 in which an opening 68a is formed in a region corresponding to the pMOS formation region 30 is formed first after the second side wall spacers 67a and 67b are formed. The Si substrate 51 is doped with p-type dopant impurities, such as boron (B), by, for example, the ion implantation method with the photoresist film 68, the gate electrode 56a, and the second side wall spacers 67a as a mask in order to form the source/drain regions 69a which are deeper than the extension regions 65a. For example, the p-type dopant impurities are implanted with a dose of $5 \times 10^{15}/cm^2$ at an acceleration energy of 8 keV. After the source/drain regions 69a are formed, the photoresist film 68 is removed.

Figure 18:
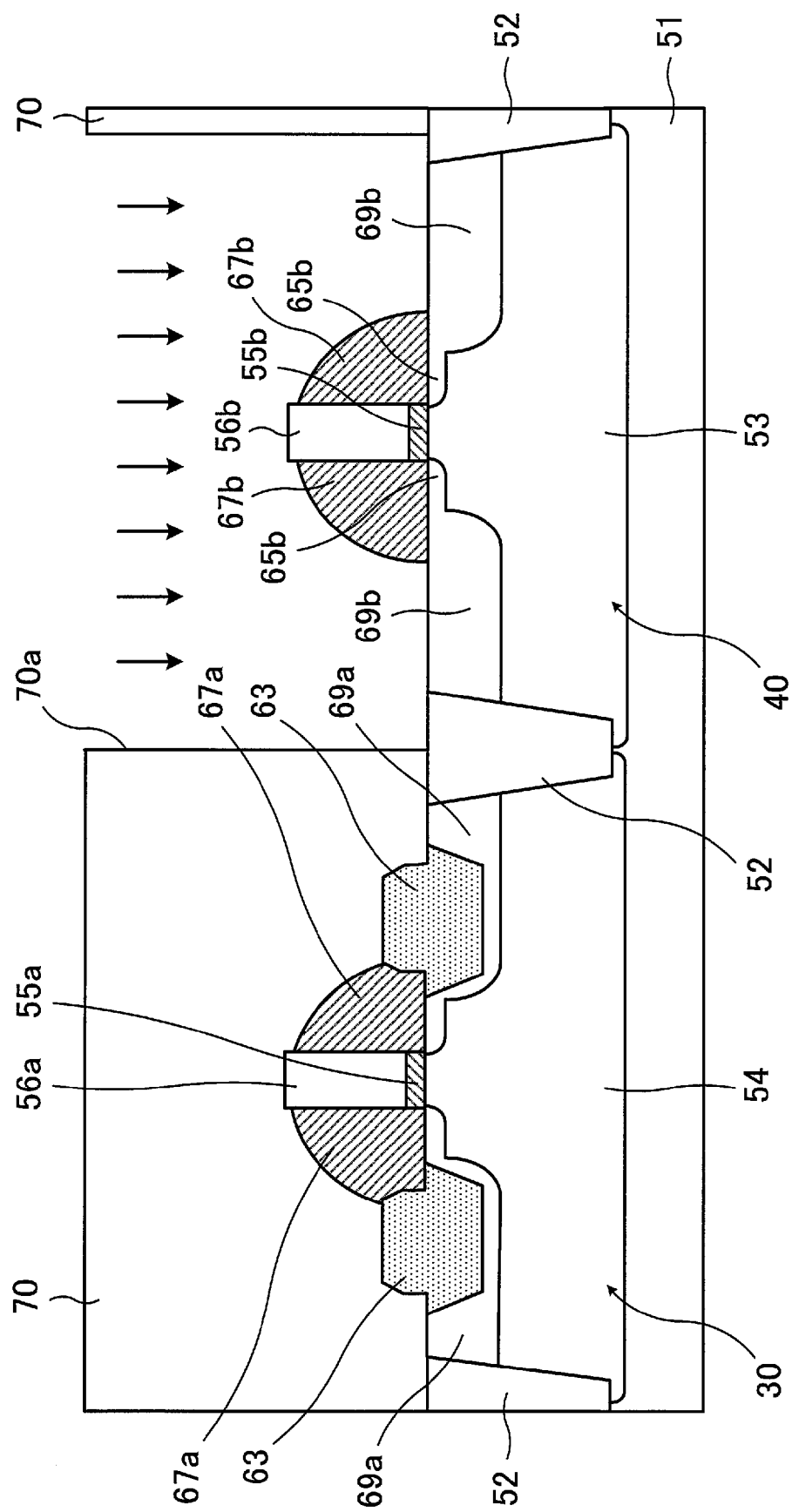
FIG. 18 is a fragmentary schematic sectional view showing a second source/drain region formation step.

FIG. 18 is a fragmentary schematic sectional view showing a second source/drain region formation step.

After that, the same step is performed in the nMOS formation region 40. That is to say, as shown in FIG. 18, a photoresist film 70 in which an opening 70a is formed in a region corresponding to the nMOS formation region 40 is formed. The Si substrate 51 is then doped with n-type dopant impurities, such as arsenic (As) or phosphorus (P), in order to form source/drain regions 69b which are deeper than the extension regions 65b. For example, the n-type dopant impurities are implanted with a dose of $1 \times 10^{16}/cm^2$ at an acceleration energy of 6 keV. After the source/drain regions 69b are formed, the photoresist film 70 is removed.

After the source/drain regions 69a and 69b are formed in this way, heat treatment is performed by, for example, a rapid thermal annealing (RTA) method for activating the dopant impurities with which the Si substrate 51 is doped. For example, annealing is performed as the heat treatment at a temperature of 1,000° C. or more for a short period of time.

Figure 19:
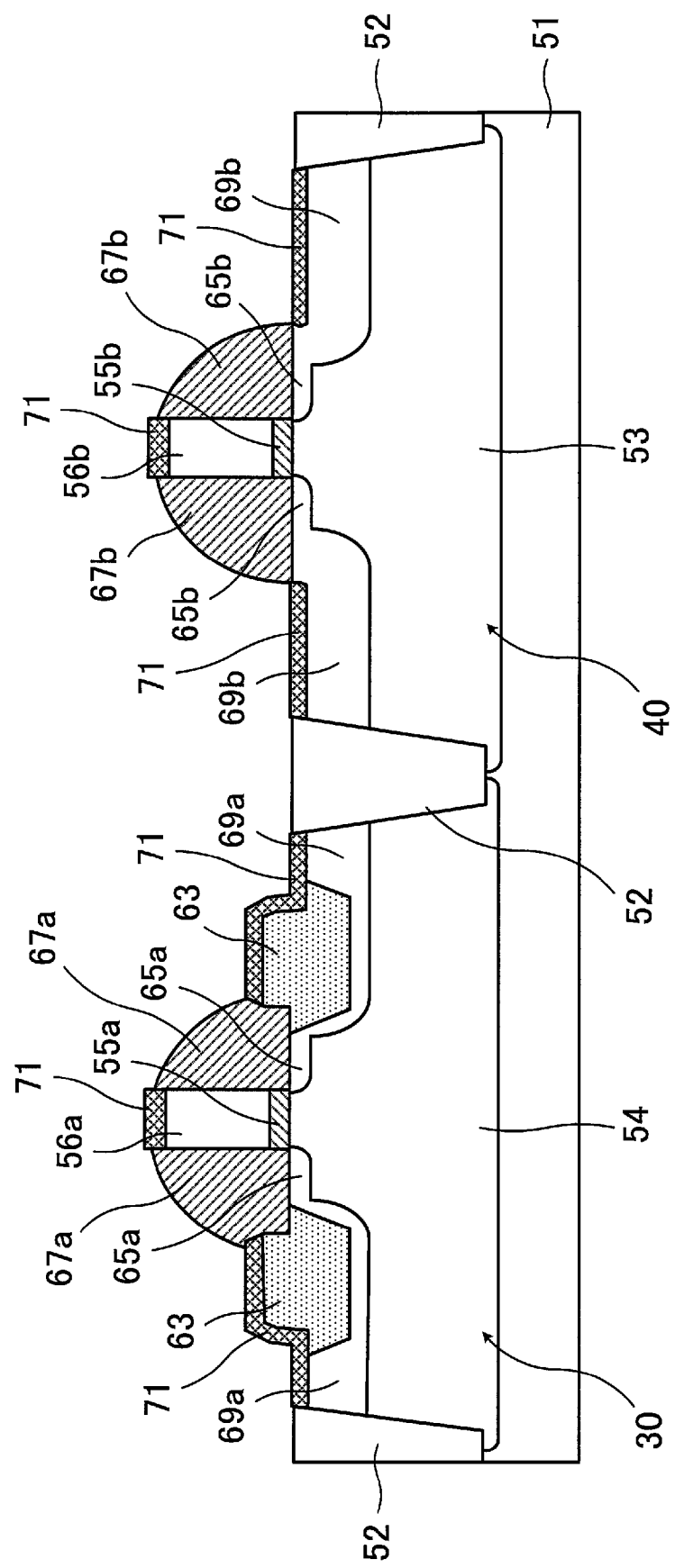
FIG. 19 is a fragmentary schematic sectional view showing a silicidation step.

FIG. 19 is a fragmentary schematic sectional view showing a silicidation step.

To perform silicidation, a nickel film with a thickness of about 5 to 20 nm, for example, is formed first over an entire surface by a sputtering method or the like. Heat treatment is then performed in order to make nickel react with silicon. This heat treatment is performed at a temperature of 100 to 500° C. in an inert atmosphere of $N_2$, Ar, or the like. The nickel film which does not react with silicon is then removed by the use of, for example, a mixed solution of hydrochloric acid and oxygenated water. Second heat treatment is performed at a temperature of 200 to 500° C. in an inert atmosphere of $N_2$, Ar, or the like as occasion arises. By doing so, as shown in FIG. 19, a nickel silicide film 71 is formed in a surface portion of each of the gate electrodes 56a and 56b, the source/drain regions 69a and 69b, and the SiGe layer 63. The thickness of a silicide layer is about 10 to 40 nm.

In this case, the SiGe layer 63 is formed apart from the isolation region 52. Accordingly, the formation of a spike near the isolation region 52 can be suppressed and a leakage current of the pMOS transistor caused by such a spike can effectively be suppressed.

In this example, the SiGe layer 63 is formed apart only from the end portions of the isolation region 52 parallel to the gate width direction W. As a result, it is possible to create a sufficient stress in the channel region, while ensuring the volume of the SiGe layer 63 in the PMOS formation region 30. Accordingly, the operation speed of the pMOS transistor can be increased. In addition, the formation of a spike can be suppressed.

In the above descriptions, as shown in FIGS. 8 and 9, the opening 60a is formed in the photoresist film 60 at the time of forming the first side wall spacers 61 so that the portions 51a of the PMOS formation region 30 of the Si substrate 51 contiguous to the portions located in the gate length direction L of the isolation region 52 which surrounds the pMOS formation region 30 will be covered. However, an opening formed in the photoresist film 60 may have a shape shown in FIG. 20 or 21.

Figure 20:
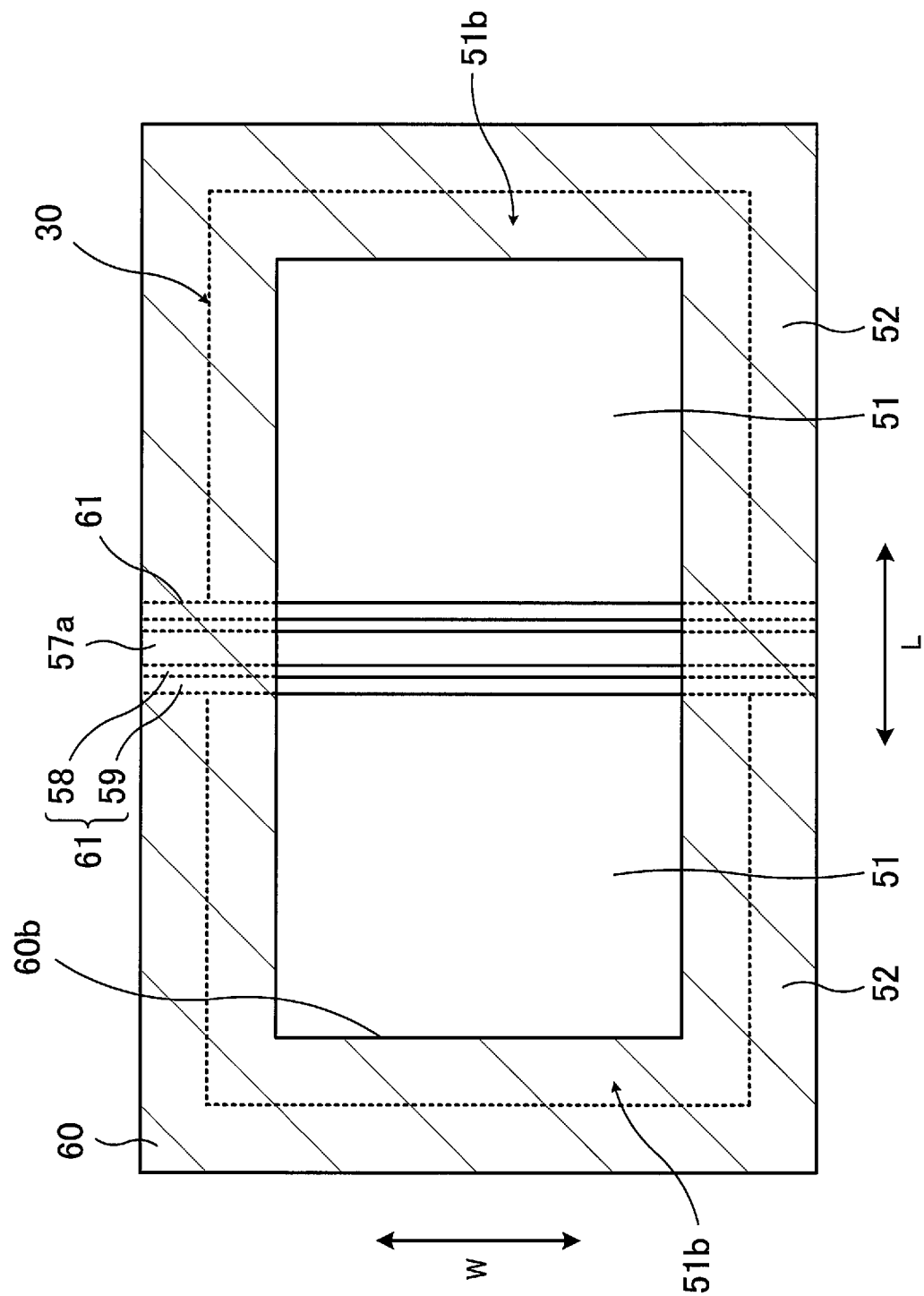
FIG. 20 is a view for describing another example of the shape of an opening formed in a photoresist film (part 1).
Figure 21:
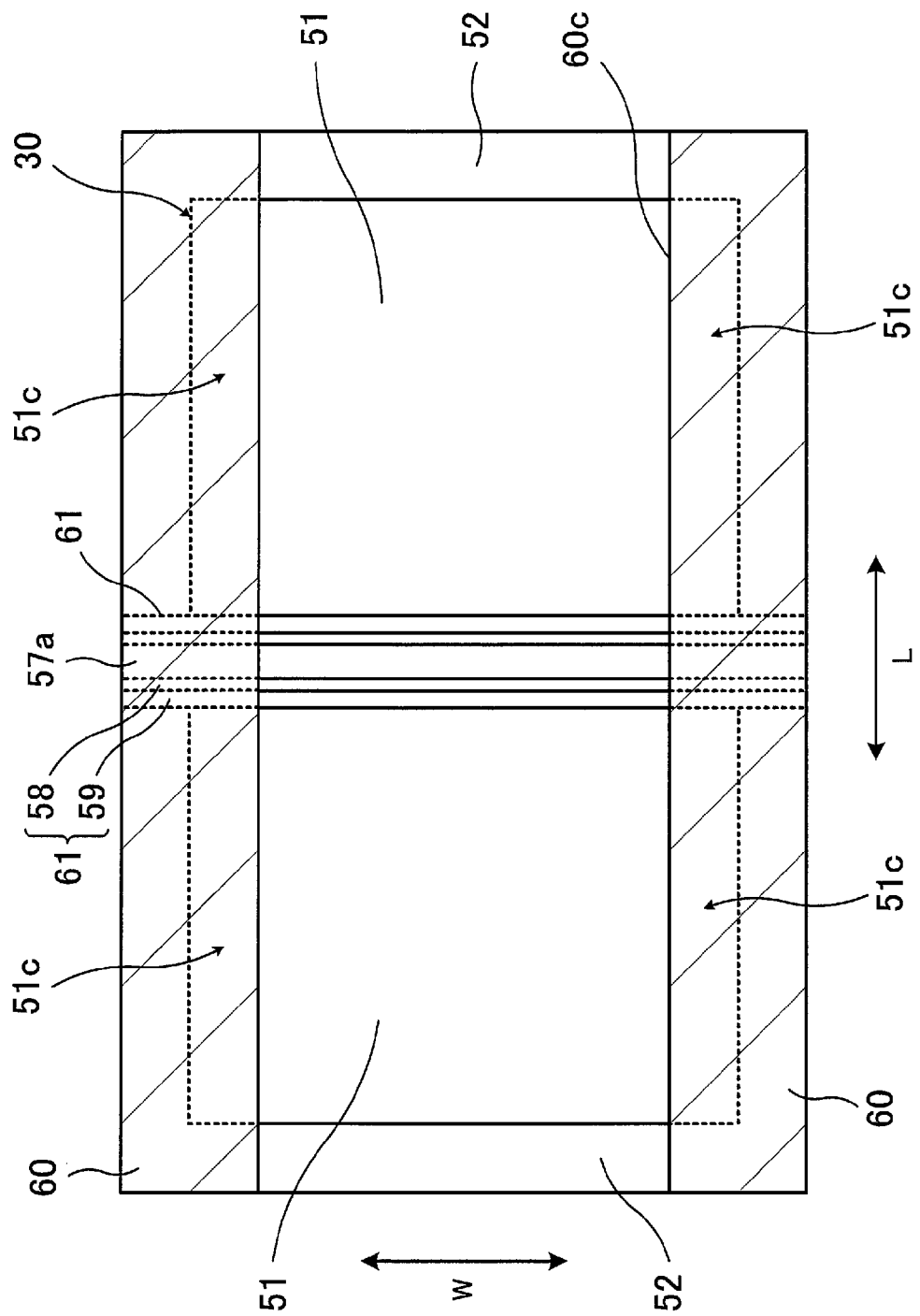
FIG. 21 is a view for describing still another example of the shape of an opening formed in the photoresist film (part 2).

FIG. 20 or 21 is a view for describing another example of the shape of an opening formed in the photoresist film. FIG. 20 or 21 is a schematic plan view showing the pMOS formation region 30 and regions around the pMOS formation region 30 in the step of forming the first side wall spacers 61. This is the same with FIG. 9.

In the example shown in FIG. 20, an opening 60b is formed in the photoresist film 60 so that all end portions of the pMOS formation region 30 will be covered.

If the opening 60b is formed, the first side wall spacers 61 are formed on the sides of the gate electrode 56a. This is the same with FIG. 8. In addition, the silicon oxide film 58 and the silicon nitride film 59 are left over all portions 51b of the pMOS formation region 30 of the Si substrate 51 contiguous to the isolation region 52. Recesses are formed with the first side wall spacers 61 and the photoresist film 60 as a mask. This is the same with FIGS. 10 and 11. A SiGe layer is formed in the recesses formed. This is the same with FIG. 12. As a result, the SiGe layer is formed apart from all portions of the isolation region 52 which surrounds the pMOS formation region 30.

Forming the SiGe layer in such a region suppresses the formation of a spike near the isolation region 52 more effectively at the time of silicidation. Accordingly, a leakage current can be suppressed more effectively.

In the example shown in FIG. 21, an opening c is formed in the photoresist film 60 so that part of end portions of the pMOS formation region 30 perpendicular to the gate width direction W will be covered.

If the opening c is formed, the first side wall spacers 61 are formed and the silicon oxide film 58 and the silicon nitride film 59 are left over portions 51c of the pMOS formation region 30 of the Si substrate 51 contiguous to portions of the isolation region 52 located in the gate width direction W. Recesses are formed with the first side wall spacers 61 and the photoresist film 60 as a mask. A SiGe layer is formed in the recesses. As a result, the SiGe layer is formed apart from the portions located in the gate width direction W of the isolation region 52 which surrounds the pMOS formation region 30.

Forming the SiGe layer in such a region also suppresses the formation of a spike near the isolation region 52 effectively at the time of silicidation. Accordingly, a leakage current can be suppressed effectively.

The shape of an opening to be formed in the photoresist film 60 should be set on the basis of where a SiGe layer is formed.

In the above descriptions, the case where the SiGe layer is formed as a semiconductor layer for creating a stress in the channel region of the pMOS transistor is mainly taken as an example. As stated above, however, a SiGeC layer may be formed in place of the SiGe layer.

In addition, a semiconductor layer can be formed for creating a stress in a channel region of an nMOS transistor. For example, a SiC layer can be used as such a semiconductor layer. Moreover, if such a semiconductor layer is formed in an nMOS transistor, the semiconductor layer can be formed apart from at least part of an isolation region. This is the same with the above case.

Figure 23:
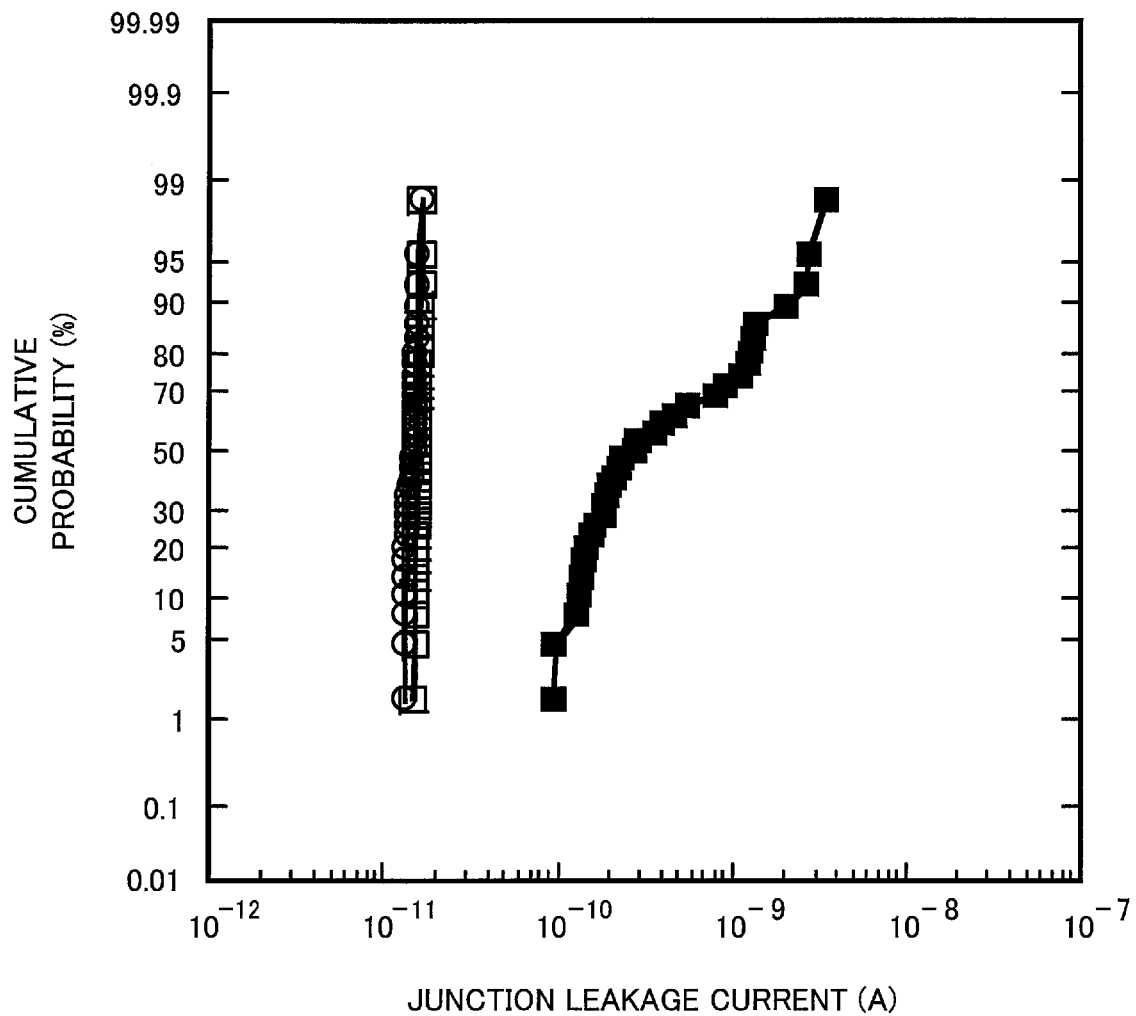
FIG. 23 is a view showing results obtained by measuring a leakage current which flows to the substrate in the case of the transistor shown in FIG. 2.

FIG. 23 is a view showing results obtained by measuring a leakage current which flows to the substrate in the case of the transistor shown in FIG. 2. In FIG. 2, a horizontal axis indicates a junction leakage current (A) and a vertical axis indicates cumulative probability (%). Results obtained by measuring a leakage current of a transistor having the structure shown in FIG. 2 are indicated by open circles. A SiGe layer is formed 50 nanometers apart from all portions of an isolation region. Results obtained by measuring a leakage current of a transistor to which the present invention is not applied and in which an ordinary SiGe layer is formed are indicated by black squares. Results obtained by measuring a leakage current of a transistor in which a source and a drain are not formed by the use of SiGe are indicated by open squares for the sake of comparison.

As can be seen from FIG. 23, a leakage current caused by a spike is suppressed by applying the present invention. The value of a leakage current of the transistor having the structure shown in FIG. 2 is equal to that of a leakage current of the transistor in which the source and the drain are not formed by the use of SiGe.

Figure 24:
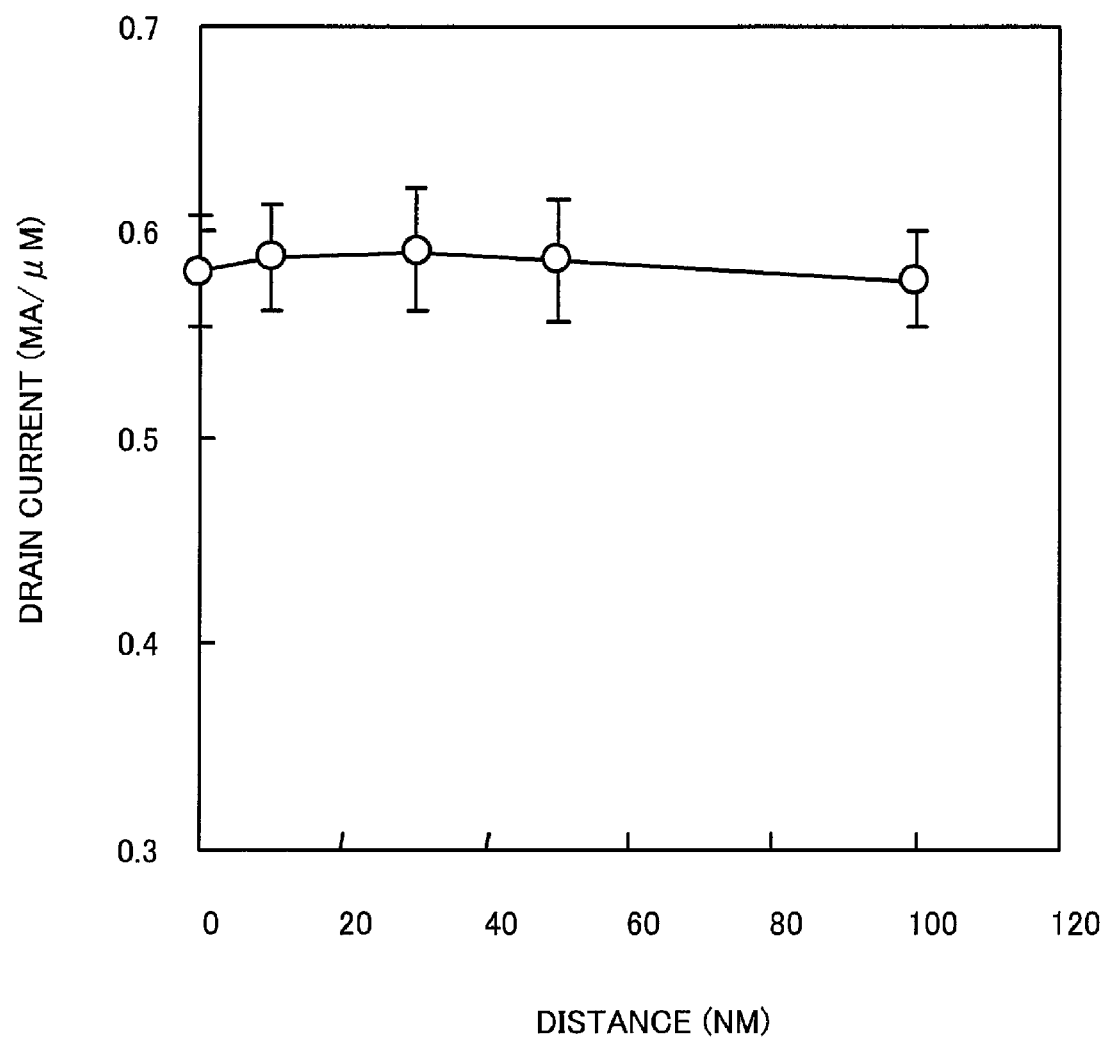
FIG. 24 is a view showing the relationship between the distance between a SiGe layer and an isolation region and drain current.

FIG. 24 is a view showing the relationship between the distance (nm) between a SiGe layer and an isolation region and drain current (mA/μm). The distance was increased to 100 nm in pMOS transistors each having the structure shown in FIG. 2 and measurement was made. Drain current slightly decreases with an increase in the distance. However, drain current which flows in the PMOS transistors each having the structure shown in FIG. 2 is more than drain current (about 0.4 mA/μm) which flows in transistors in which a source and a drain are not formed by the use of SiGe.

Figure 25:
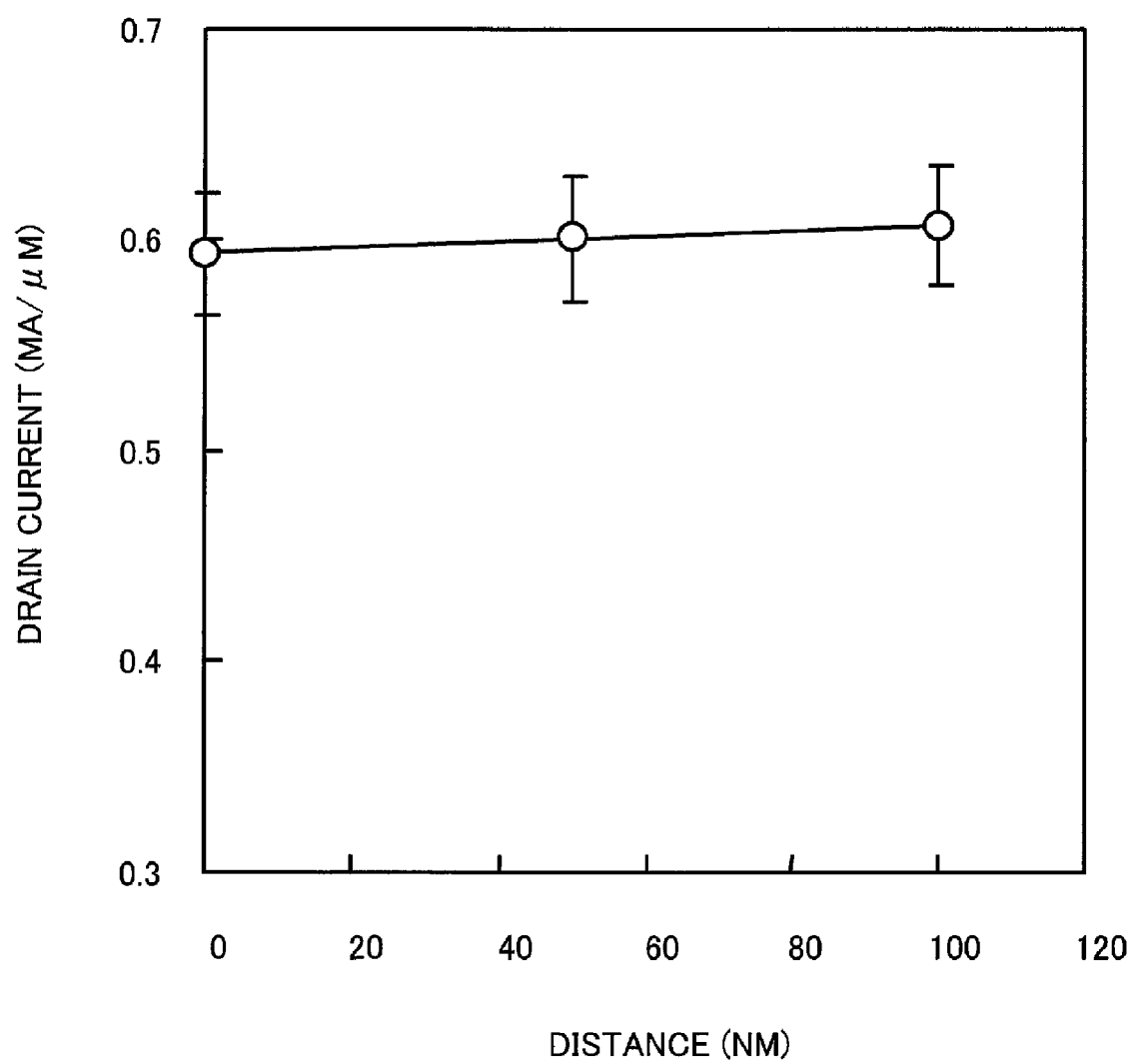
FIG. 25 is a view showing the relationship between the distance between a SiGe layer and an isolation region and drain current.

FIG. 25 is a view showing the relationship between the distance (nm) between a SiGe layer and an isolation region and drain current (mA/μm). The distance was increased to 100 nm in pMOS transistors each having the structure shown in FIG. 3. However, drain current does not decrease.

Figure 26:
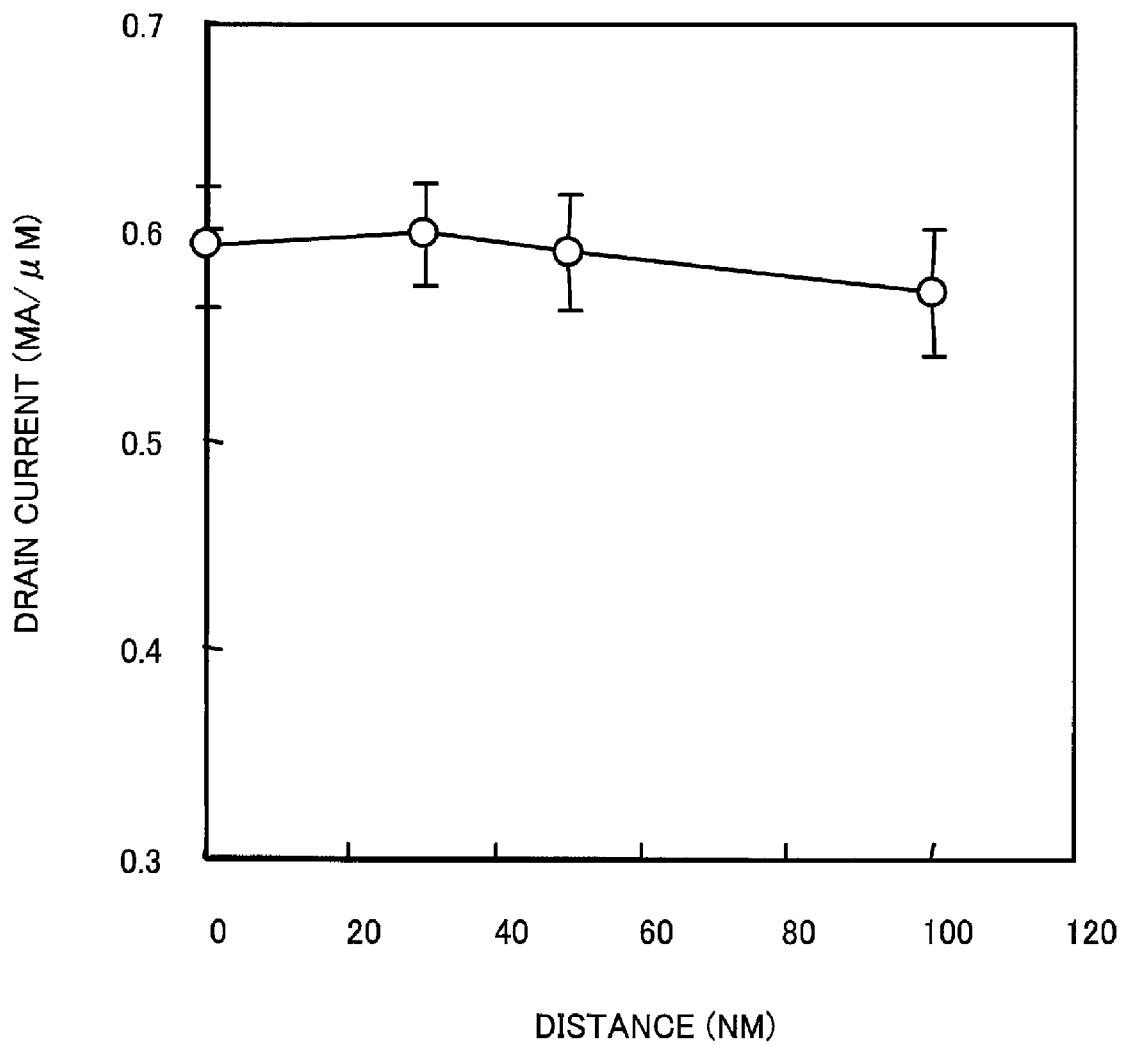
FIG. 26 is a view showing the relationship between the distance between a SiGe layer and an isolation region and drain current.

FIG. 26 is a view showing the relationship between the distance (nm) between a SiGe layer and an isolation region and drain current (mA/μm). pMOS transistors each having the structure shown in FIG. 4 were used. Drain current slightly decreases with an increase in the distance. However, drain current which flows in the pMOS transistors each having the structure shown in FIG. 4 is more than drain current (about 0.4 mA/μm) which flows in transistors in which a source/drain of SiGe is not formed.

As has been described in the foregoing, a semiconductor layer used for creating a stress in a channel region of a MOS transistor is formed apart from at least part of an isolation region. By doing so, the formation of a spike is suppressed at the time of silicidation. Therefore, it is possible to suppress a leakage current caused by a spike, while ensuring a certain level of a stress in the channel region. As a result, high performance semiconductor devices with high reliability can be fabricated with a high yield.

In the present invention, a semiconductor layer is formed in an element region defined by an isolation region, apart from at least part of the isolation region. By doing so, a high performance semiconductor device with high reliability in which a leakage current is suppressed even after silicidation can be realized.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   an isolation region in a semiconductor substrate;
   a gate electrode over an element region defined by the isolation region in the semiconductor substrate;
   semiconductor layers in the element region at both sides of the gate electrode apart from at least part of the isolation region;
   an impurity region that is a source region or a drain region between the isolation region and the semiconductor layers in the semiconductor substrate; and
   silicide layers on the impurity region and the semiconductor layers.

2. The semiconductor device according to claim 1, wherein the semiconductor layers differ from the semiconductor substrate in lattice constant.

3. The semiconductor device according to claim 1, wherein:
   the semiconductor substrate is a silicon substrate; and
   the semiconductor layers are SiGe layers, a SiGeC layers, or SiC layers.

4. The semiconductor device according to claim 1, wherein the semiconductor layers are apart from portions of the isolation region which are located in a direction of gate length of the gate electrode.

5. The semiconductor device according to claim 1, wherein the semiconductor layers are apart from portions of the isolation region which are located in a direction of gate width of the gate electrode.

6. The semiconductor device according to claim 1, wherein distances between the semiconductor layers and the isolation region are 5 nm to 100 nm.

7. The semiconductor device according to claim 1, further comprising,
spacers on side walls of the gate electrode, wherein a part of the semiconductor layers are under the spacers.

8. A semiconductor device comprising:
an isolation region in a semiconductor substrate;
a gate electrode over an element region defined by the isolation region formed in the semiconductor substrate;
recesses in the element region at both sides of the gate electrode apart from at least part of the isolation region;
semiconductor layers in the recesses;
an impurity region that is a source region or a drain region between the isolation region and the semiconductor layers in the semiconductor substrate; and
silicide layers on the impurity region and the semiconductor layers.

9. The semiconductor device according to claim 8, wherein the semiconductor layers differ from the semiconductor substrate in lattice constant.

10. The semiconductor device according to claim 8, wherein:
the semiconductor substrate is a silicon substrate; and
the semiconductor layers are SiGe layers, SiGeC layers, or SiC layers.

11. The semiconductor device according to claim 8, wherein the semiconductor layers are apart from portions of the isolation region which are located in a direction of gate length of the gate electrode.

12. The semiconductor device according to claim 8, wherein the semiconductor layers are apart from portions of the isolation region which are located in a direction of gate width of the gate electrode.

13. The semiconductor device according to claim 8, wherein distances between the semiconductor layers and the isolation region are 5 nm to 100 nm.

14. The semiconductor device according to claim 8, further comprising,
spacers on side walls of the gate electrode, wherein a part of the semiconductor layers are under the spacers.

* * * * *